(12) United States Patent
Lee

(10) Patent No.: US 12,136,633 B2
(45) Date of Patent: Nov. 5, 2024

(54) IMAGE SENSORS

(71) Applicant: Samsung Electronics Co., Ltd., Suwon-si (KR)

(72) Inventor: Seungwook Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 456 days.

(21) Appl. No.: 17/667,620

(22) Filed: Feb. 9, 2022

(65) Prior Publication Data

US 2022/0336506 A1 Oct. 20, 2022

(30) Foreign Application Priority Data

Apr. 16, 2021 (KR) .................. 10-2021-0050015

(51) Int. Cl.
*H01L 27/14* (2006.01)
*H01L 27/146* (2006.01)

(52) U.S. Cl.
CPC .. *H01L 27/14603* (2013.01); *H01L 27/14614* (2013.01); *H01L 27/14641* (2013.01)

(58) Field of Classification Search
CPC ......... H01L 27/14603; H01L 27/14607; H01L 27/14614; H01L 27/14641; H01L 31/062; H01L 31/0352
See application file for complete search history.

(56) References Cited

U.S. PATENT DOCUMENTS

| 6,838,301 | B2 | 1/2005 | Zheng et al. |
| 7,608,903 | B2 | 10/2009 | Mouli |
| 8,247,854 | B2* | 8/2012 | Kang ................ H01L 27/14645 257/292 |
| 8,937,272 | B2 | 1/2015 | Hynecek |
| 9,363,451 | B2 | 6/2016 | Ammo |
| 9,385,157 | B2 | 7/2016 | Jung et al. |
| 9,735,197 | B1 | 8/2017 | Kwag et al. |
| 10,340,305 | B2 | 7/2019 | Ma et al. |
| 2007/0246756 | A1 | 10/2007 | Mouli |
| 2013/0248954 | A1* | 9/2013 | Ahn ........................ H01L 31/02 257/292 |
| 2014/0218578 | A1 | 8/2014 | Kohyama |
| 2018/0294304 | A1 | 10/2018 | Janssens et al. |

FOREIGN PATENT DOCUMENTS

| JP | 2015115503 A | 6/2015 |
| KR | 10-2014-0099811 A | 8/2014 |
| KR | 10-2016-0007217 A | 1/2016 |
| WO | 2020262131 A1 | 12/2020 |

* cited by examiner

*Primary Examiner* — Kevin K Pyo
(74) *Attorney, Agent, or Firm* — MORGAN, LEWIS & BOCKIUS LLP

(57) ABSTRACT

Image sensors may include a base substrate including a substrate layer, a buried insulation layer on the substrate layer, and a semiconductor layer on the buried insulation layer, a photo sensing device in the substrate layer, a buried impurity region spaced apart from the photo sensing device in an upper portion of the substrate layer, a transfer gate including a vertical gate extending through the semiconductor layer and the buried insulation layer and extending into an inner portion of the substrate layer, which is between the photo sensing device and the buried impurity region, a planar gate on the semiconductor layer, and a gate insulation layer between the substrate layer and the planar gate.

20 Claims, 25 Drawing Sheets

IMAGE SENSORS

CROSS-REFERENCE TO RELATED APPLICATION

This application is based on and claims priority under 35 U.S.C. § 119 to Korean Patent Application No. 10-2021-0050015, filed on Apr. 16, 2021, in the Korean Intellectual Property Office, the disclosure of which is incorporated by reference herein in its entirety.

BACKGROUND

The inventive concept relates to an image sensor, and more particularly, to an image sensor including a plurality of unit pixels.

Image sensors may include a plurality of unit pixels arranged as a two-dimensional (2D) array. Generally, each of the unit pixels may include a photodiode and a plurality of pixel transistors that may include, for example, a transfer transistor, a reset transistor, a source follower transistor, and a selection transistor.

SUMMARY

The inventive concept provides an image sensor in which a size of each unit pixel is reduced or minimized.

The inventive concept provides the following image sensors. According to some embodiments of the present inventive concept, there are provided image sensors that may include a base substrate including a substrate layer having a first conductive type and including a first surface and a second surface opposite to each other, a buried insulation layer on the first surface of the substrate layer, and a semiconductor layer on the buried insulation layer, a photo sensing device in the substrate layer, the photo sensing device including an impurity region having a second conductive type that is different from the first conductive type, a buried impurity region that is spaced apart from the photo sensing device in an upper portion of the substrate layer (e.g., a potion is adjacent to the buried insulation layer), the buried impurity region including an impurity region having the second conductive type, a transfer gate including a vertical gate extending through the semiconductor layer and the buried insulation layer and extending into an inner portion of the substrate layer, the inner portion of the substrate layer being between the photo sensing device and the buried impurity region, a planar gate on the semiconductor layer, and a gate insulation layer between the substrate layer and the planar gate.

According to some embodiments of the present inventive concept, there are provided image sensors that may include a base substrate where a substrate layer having a first conductive type and including a first surface and a second surface opposite to each other, a buried insulation layer on the first surface of the substrate layer, and a semiconductor layer on the buried insulation layer configure a silicon on insulator (SOI) structure, a plurality of photo sensing devices that are spaced apart from one another in the substrate layer, the plurality of photo sensing devices each including a top surface at a first vertical level and an impurity region having a second conductive type that is different from the first conductive type, a buried impurity region that is in the substrate layer and is spaced apart from the plurality of photo sensing devices to extend along a region between the plurality of photo sensing devices one-dimensionally (e.g., shown in a plan view), the buried impurity region including an impurity region having the second conductive type in an upper portion of the substrate layer (e.g., a portion adjacent to the buried insulation layer), a plurality of transfer gates passing through the semiconductor layer and the buried insulation layer, extending into an inner portion of the substrate layer between each of the plurality of photo sensing devices and the buried impurity region, filling a plurality of vertical gate holes each including a bottom surface disposed at a second vertical level, and overlapping portions of the plurality of photo sensing devices corresponding thereto in a vertical direction without overlapping the buried impurity region in the vertical direction, and a plurality of planar gates that are spaced apart from one another on the semiconductor layer in a direction which differs from an extension direction of the buried impurity region.

According to some embodiments of the present inventive concept, there are provided image sensors that may include a base substrate where a substrate layer having a first conductive type and including a first surface and a second surface opposite to each other, a buried insulation layer on the first surface of the substrate layer, and a semiconductor layer on the buried insulation layer configure a silicon on insulator (SOI) structure, a plurality of photo sensing devices spaced apart from one another in the substrate layer and arranged to configure columns and rows in each of a first horizontal direction and a second horizontal direction that may be perpendicular to the first horizontal direction, the plurality of photo sensing devices each including an impurity region having a second conductive type that is different from the first conductive type, a buried impurity region spaced apart from the plurality of photo sensing devices to extend in the second horizontal direction between the plurality of photo sensing devices one-dimensionally (e.g., shown in a plan view), the buried impurity region including an impurity region having the second conductive type in an upper portion of the substrate layer (e.g., a portion adjacent to the buried insulation layer), a plurality of transfer gates extending through the semiconductor layer and the buried insulation layer, extending into an inner portion of the substrate layer between each of the plurality of photo sensing devices and the buried impurity region, filling a plurality of vertical gate holes each including a bottom surface disposed at a second vertical level, and overlapping portions of the plurality of photo sensing devices corresponding thereto in a vertical direction without overlapping the buried impurity region in the vertical direction, a plurality of planar gates spaced apart from one another on the semiconductor layer in the first horizontal direction, a gate insulation layer between the substrate layer and the plurality of transfer gates and between the substrate layer and the plurality of planar gates, a plurality of impurity regions in the semiconductor layer adjacent respective sides of the plurality of planar gates in the first horizontal direction, the plurality of impurity regions including a source region and a drain region, a plurality of color filter layers on the second surface of the substrate layer, at least a portion of each of the plurality of color filter layers overlapping a corresponding photo sensing device of the plurality of photo sensing devices in the vertical direction, and a plurality of microlenses respectively on the plurality of color filter layers.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
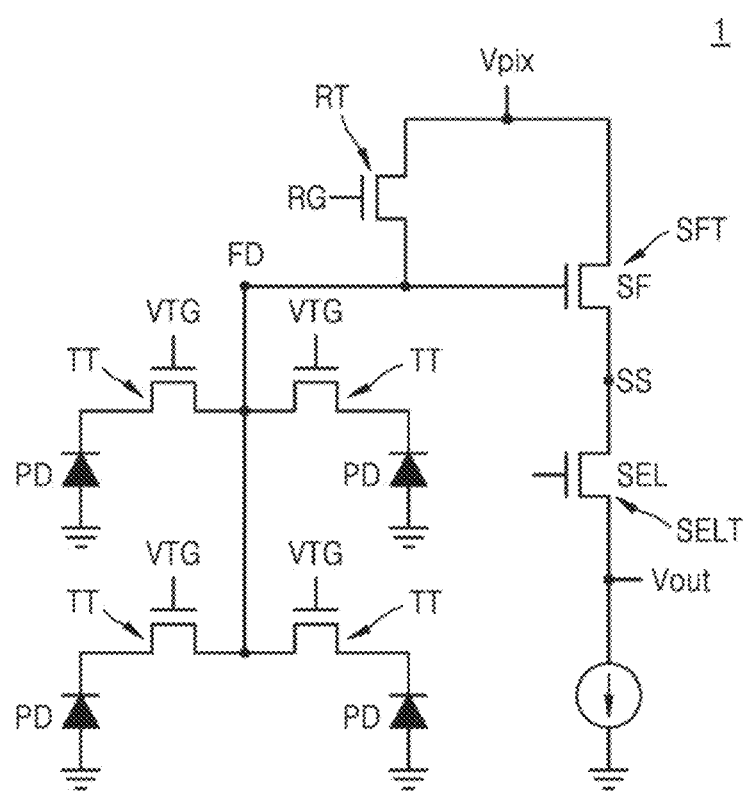
FIG. 1 is an equivalent circuit diagram of an image sensor according to some embodiments of the present inventive concept.

FIG. 1 is an equivalent circuit diagram of an image sensor 1 according to some embodiments of the present inventive concept.

Referring to FIG. 1, the image sensor 1 may include at least one photo sensing device PD, at least one transfer transistor TT, a floating diffusion region FD, a reset transistor RT, a source follower transistor SFT, and a selection transistor SELT. The photo sensing device PD and the transfer transistor TT may configure a unit pixel.

The transfer transistor TT, the reset transistor RT, the source follower transistor SFT, and the selection transistor SELT may respectively include a transfer gate VTG, a reset gate RG, a source follower gate SF, and a selection gate SEL. In some embodiments, the at least one transfer gate VTG may be a vertical gate, and each of the reset gate RG, the source follower gate SF, and the selection gate SEL may be a planar gate. The at least one transfer gate VTG may be disposed between the at least one photo sensing device PD and the floating diffusion region FD, and the at least one transfer transistor TT may transfer an electric charge, generated by the at least one photo sensing device PD, to the floating diffusion region FD. As used herein, a vertical gate refers to a gate including a portion that extends into a base substrate (e.g., a base substrate 100 in FIGS. 3A and 3B), and a planar gate refers to a gate not including a portion that extends into the base substrate.

The at least one transfer transistor TT may include the at least one transfer gate VTG, and a source region and a drain region respectively connected to the floating diffusion region FD and the photo sensing device PD. The reset transistor RT may include the reset gate RG, a source region connected to the floating diffusion region FD, and a drain region connected to a source voltage Vpix. The source follower transistor SFT may include the source follower gate SF connected to the floating diffusion region FD, a shared source region SS shared by the selection transistor SELT, and a drain region connected to the source voltage Vpix. The selection transistor SEL may include the selection gate SEL, a shared source region SS shared by the source follower transistor SFT, and a drain region connected to an output voltage Vout.

In FIG. 1, it is illustrated that four unit pixels including four photo sensing devices PD may configure a shared pixel which shares one floating diffusion region FD, one reset transistor RT, one source follower transistor SFT, and one selection transistor SELT through four transfer transistors TT, but the present inventive concept is not limited thereto. In some embodiments, two unit pixels including two photo sensing devices PD may configure a shared pixel which shares one floating diffusion region FD, one reset transistor RT, one source follower transistor SFT, and one selection transistor SELT through two transfer transistors TT. In some embodiments, one unit pixel including one photo sensing device PD may be connected to one floating diffusion region FD, one reset transistor RT, one source follower transistor SFT, and one selection transistor SELT through one transfer transistors TT.

Figure 2:
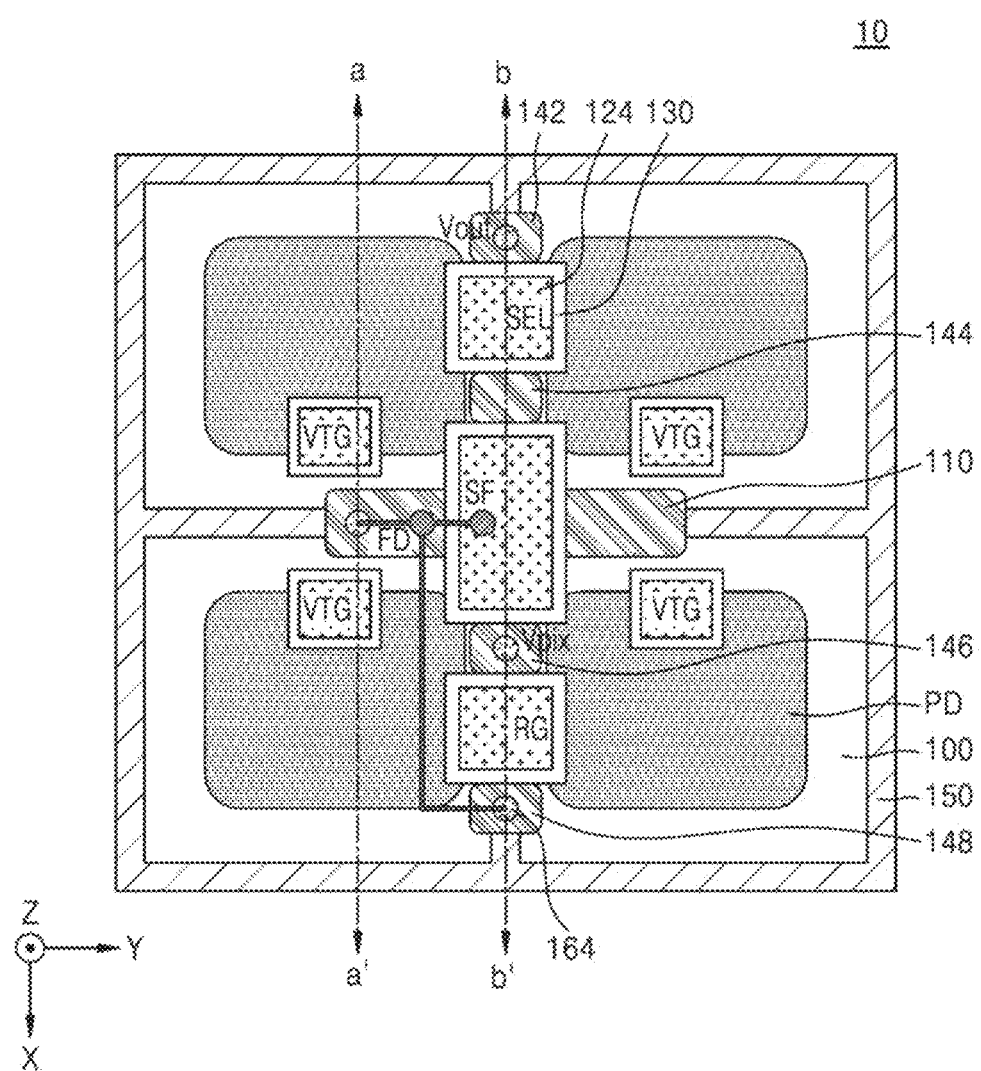
FIG. 2 is a plan layout of a main portion of an image sensor according to some embodiments of the present inventive concept.

FIG. 2 is a plan layout of a portion of an image sensor 10 according to some embodiments of the present inventive concept.

Referring to FIG. 2, the image sensor 10 may include a base substrate 100 where a plurality of photo sensing devices PD are formed, a pixel separation region 150 surrounding a periphery of each of the plurality of photo sensing devices PD, a floating diffusion region FD disposed adjacent to the plurality of photo sensing devices PD, a plurality of transfer gates VTG corresponding to the plurality of photo sensing devices PD, a reset gate RG, a source follower gate SF, and a selection gate SEL.

The transfer gate VTG, the reset gate RG, the source follower gate SF, and the selection gate SEL may respectively configure the transfer transistor TT, the reset transistor RT, the source follower transistor SFT, and the selection transistor SELT each illustrated in FIG. 1. The transfer gate VTG, the reset gate RG, the source follower gate SF, and the selection gate SEL may each include a gate conductive layer 124. For example, the gate conductive layer 124 may include at least one of doped polysilicon, metal, metal silicide, metal nitride, and a metal-containing film. A gate spacer 130 may surround a periphery of the gate conductive layer 124. For example, the gate spacer 130 may cover a sidewall of each of the reset gate RG, the source follower gate SF, and the selection gate SEL. For example, the gate spacer 130 may cover a sidewall of a portion of an upper portion of the transfer gate VTG.

In some embodiments, the plurality of photo sensing devices PD may be arranged to form a matrix including columns and rows in a first horizontal direction (an X direction) and a second horizontal direction (a Y direction) perpendicular to the first horizontal direction (the X direction).

The transfer gate VTG may be disposed between the floating diffusion region FD and the photo sensing device PD. In some embodiments, at least a portion of the transfer gate VTG and a portion of the photo sensing device PD corresponding to each other may overlap each other in a vertical direction (a Z direction). The transfer gate VTG may not overlap the floating diffusion region FD including a buried impurity region 110 in the vertical direction (the Z direction). As used herein, "an element A overlapping an element B in a direction W" (or similar language) may mean that at least one line extending in the direction W can be drawn that intersects both elements A and B.

In some embodiments, one floating diffusion region FD included in the image sensor 10 may be disposed adjacent to four photo sensing devices PD, and four transfer gates VTG may be disposed between one floating diffusion region FD and four photo sensing devices PD. For example, the floating diffusion region FD may extend in the second horizontal direction (the Y direction) along a region between photo sensing devices PD apart from each other in the first horizontal direction (the X direction) one-dimensionally (i.e., in terms of a top view). The floating diffusion region FD may be apart from the plurality of photo sensing devices PD in the first horizontal direction (the X direction) one-dimensionally (i.e., in terms of a top view). In some embodiments, the selection gate SEL, the source follower gate SF, and the reset gate RG may be disposed apart from one another in the first horizontal direction (the X direction). At least a portion of the source follower gate SF may overlap a portion of the diffusion region FD in the vertical direction (the Z direction).

A plurality of impurity regions 142, 144, 146, and 148 may be disposed at both sides of the selection gate SEL, the source follower gate SF, and the reset gate RG in the first horizontal direction. The plurality of impurity regions 142, 144, 146, and 148 may be source regions and drain regions of the selection gate SEL, the source follower gate SF, and the reset gate RG. The plurality of impurity regions 142, 144, 146, and 148 may include a first impurity region 142, a second impurity region 144, a third impurity region 146, and a fourth impurity region 148. For example, in the first horizontal direction (the X direction), the first impurity region 142 and the second impurity region 144 may be disposed adjacent (e.g., at) opposing sides of the selection gate SEL, respectively, the second impurity region 144 and the third impurity region 146 may be disposed adjacent (e.g., at) opposing sides of the source follower gate SF, respectively, and the third impurity region 146 and the fourth impurity region 148 may be disposed adjacent (e.g., at) opposing sides of the reset gate RG, respectively. The first impurity region 142 may be a drain region of the selection transistor SELT connected to a source voltage Vout and illustrated in FIG. 1. The second impurity region 144 may be a shared source region SS shared by the source follower transistor SFT and the selection transistor SELT each illustrated in FIG. 1. The third impurity region 146 may be a drain region shared by the source follower transistor SFT and the reset transistor RT each illustrated in FIG. 1 and may be connected to a source voltage Vpix. The fourth impurity region 148 may be a source region of the reset transistor RT illustrated in FIG. 1 and may be connected to the floating diffusion region FD.

The floating diffusion region FD may be connected to the fourth impurity region 148 and the source follower gate SF. The floating diffusion region FD may include the buried impurity region 110.

A contact 164 may be connected to each of the floating diffusion region FD, the first impurity region 142, the third impurity region 146, the fourth impurity region 148, and the source follower gate SF. The contact 164 may be electrically connected to each of the floating diffusion region FD, the fourth impurity region 148, and the source follower gate SF.

Figure 3A:
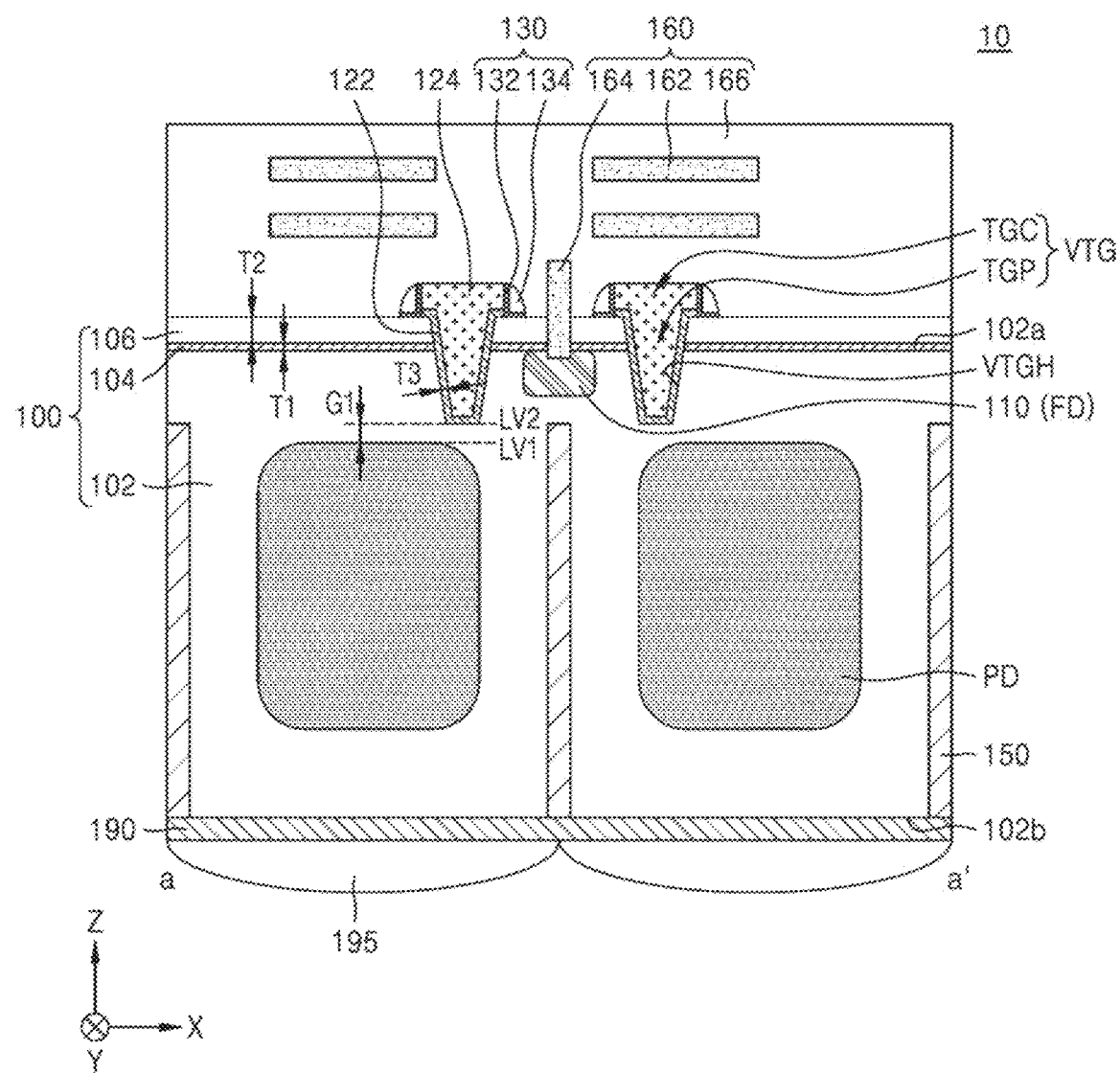
FIGS. 3A and 3B are cross-sectional views of an image sensor according to some embodiments of the present inventive concept.
Figure 3B:
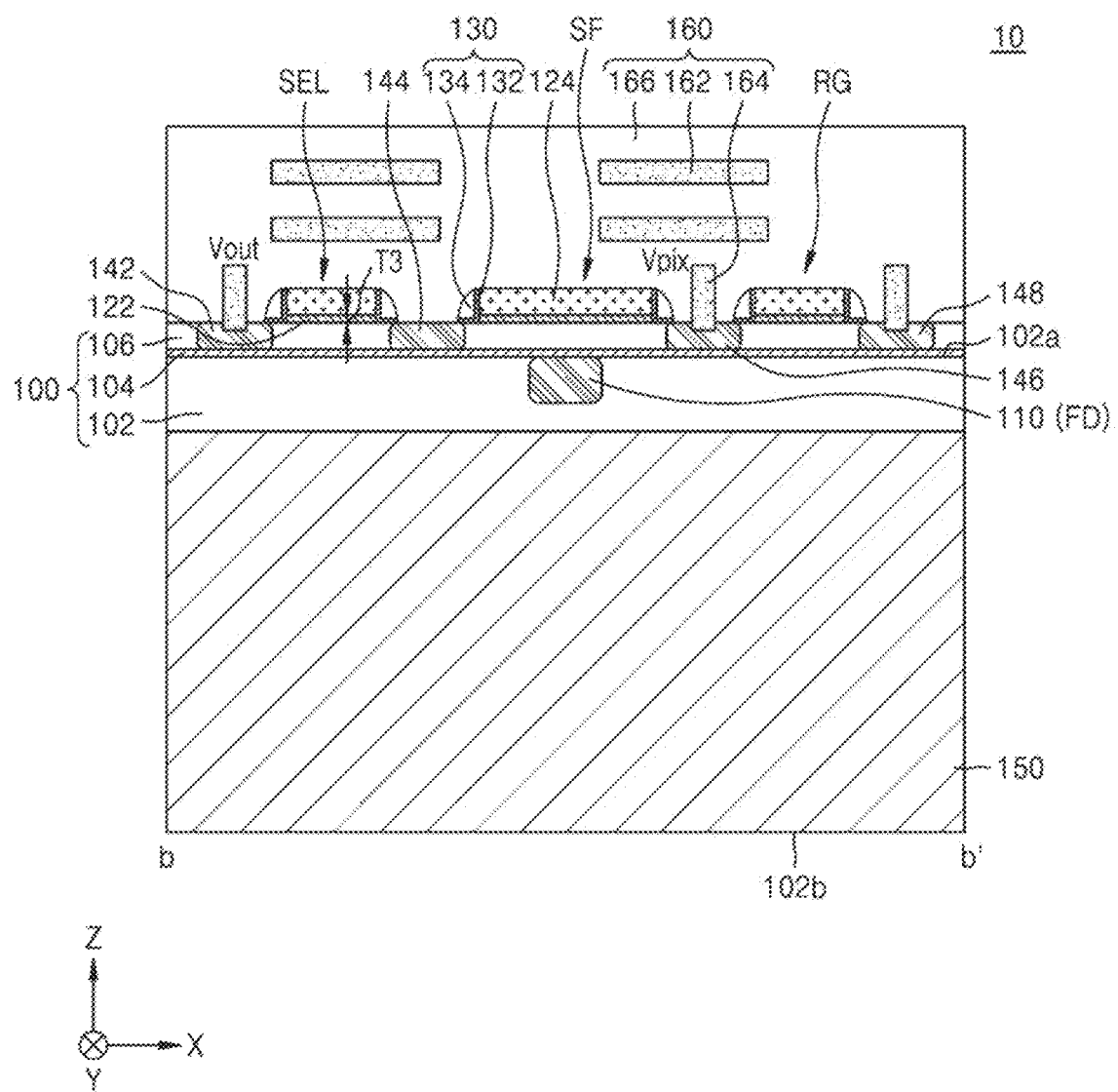

FIGS. 3A and 3B are cross-sectional views of an image sensor 10 according to some embodiments of the present inventive concept. In detail, FIGS. 3A and 3B are cross-sectional views taken along lines a-a' and b-b' of FIG. 2.

Referring to FIGS. 2, 3A, and 3B, the image sensor 10 may include a base substrate 100 which includes a substrate layer 102, a buried insulation layer 104, and a semiconductor layer 106. The base substrate 100 may include a silicon on insulator (SOI) substrate. The substrate layer 102 may include a first surface 102a and a second surface 102b, which are opposite to each other.

The substrate layer 102 may include, for example, silicon (for example, single crystalline silicon, polycrystalline silicon, or amorphous silicon). In some embodiments, the substrate layer 102 may include, for example, at least one material selected from among Ge, SiGe, SiC, GaAs, InAs, and InP. The substrate layer 102 may be formed based on a semiconductor substrate having a first conductive type. In some embodiments, the substrate layer 102 may include a p-type semiconductor substrate. In some embodiments, the substrate layer 102 may include a p-type well region formed in the p-type semiconductor substrate or the n-type semiconductor substrate.

The buried insulation layer 104 may be disposed between the substrate layer 102 and the semiconductor layer 106. The buried insulation layer 104 may include, for example, silicon oxide. The buried insulation layer 104 may cover the first surface 102a of the substrate layer 102. The buried insulation layer 104 may have a first thickness T1. For example, the first thickness T1 may be about 30 Å to about 70 Å.

The semiconductor layer 106 may include, for example, a single crystalline semiconductor material, a polycrystalline silicon material, or an amorphous semiconductor material. In some embodiments, the buried insulation layer 104 may include silicon. In some embodiments, the semiconductor layer 106 may be formed on the buried insulation layer 104 through growth or deposition. In some embodiments, the semiconductor layer 106 may be formed by attaching a separately formed semiconductor material layer on the buried insulation layer 104. The semiconductor layer 106 may have a second thickness T2 which is greater than the first thickness T1. For example, the second thickness T2 may be about 300 Å to about 700 Å. In some embodiments, the semiconductor layer 106 may be formed based on a semiconductor substrate having the first conductive type. In some embodiments, the semiconductor layer 106 may include a p-type semiconductor material.

The plurality of photo sensing devices PD may be formed adjacent to the first surface 102a of the substrate layer 102 and apart from one another in the substrate layer 102. Each of the photo sensing devices PD may be an impurity region having a second conductive type which differs from the first conductive type. For example, each of the photo sensing devices PD may be an n-type impurity region.

The pixel separation region 150 may surround each of the plurality of photo sensing devices PD, in the substrate layer 102. In some embodiments, the pixel separation region 150 may extend from the second surface 102b of the substrate layer 102 to an inner portion of the substrate layer 102. For example, the pixel separation region 150 may be apart from the first surface 102a of the substrate layer 102. The pixel separation region 150 may be, for example, deep trench isolation (DTI).

In some embodiments, the pixel separation region 150 may include a material having a refractive index which is lower than that of a material included in the substrate layer 102. For example, the pixel separation region 150 may include oxide, nitride, oxynitride, or air. The pixel separation region 150 may include a single layer including one kind of film, a double layer including two kinds of films, or a multilayer including a combination of at least three kinds of films. For example, the pixel separation region 150 may include two kinds of different insulation films. For example, the pixel separation region 150 may include silicon oxide and silicon nitride. For example, the pixel separation region 150 may include a triple layer including silicon oxide, silicon nitride, and silicon oxide. For example, the pixel separation region 150 may have a structure in which a gap is provided between at least two kinds of insulation films. It will be understood that "a gap" may be, for example, any void or cavity, and may be a gap filled with air (e.g., an air-gap), a gap filled with an inert gas or gases (e.g., an inert gas gap), a gap defining a vacuum (e.g., a vacuum gap), etc.

In some embodiments, the pixel separation region 150 may include a buried conductive layer and an insulation liner disposed between the buried insulation layer and the substrate layer 102. The buried conductive layer may include, for example, at least one of doped polysilicon, metal, metal silicide, metal nitride, and a metal-containing film. For example, the insulation liner may include metal oxide such as hafnium oxide, aluminum oxide, or tantalum oxide, or may include an insulating material such as silicon oxide, silicon nitride, or silicon oxynitride.

The buried impurity region 110 may be formed at an upper portion of the substrate layer 102 (i.e., a portion adjacent to the first surface 102a). For example, the buried impurity region 110 may extend from the first surface 102a of the substrate layer 102 to an inner portion of the substrate layer 102, but the present inventive concept is not limited thereto. In some embodiments, a top surface of the buried impurity region 110 may be apart from the first surface 102a of the substrate layer 102. The buried impurity region 110 may include an impurity region having the second conductive type. For example, the buried impurity region 110 may include an n-type impurity region. A bottom surface of the buried impurity region 110 may be disposed at a vertical level which is higher than a top surface of the photo sensing device PD. As used herein, "a surface A at a vertical level higher than a surface B" may refer to that the second surface 102b of the substrate layer 102 is closer to the surface B than the surface A, and "a surface C at a vertical level lower than a surface D may refer to that the second surface 102b of the substrate layer 102 is closer to the surface C than the surface D. The first surface 102a of the substrate layer 102 may be referred to as a top surface of the substrate layer 102, and the first surface 102b of the substrate layer 102 may be referred to as a bottom surface of the substrate layer 102.

A plurality of vertical gate holes VTGH, which pass through the semiconductor layer 106 and the buried insulation layer 104 and extend into the substrate layer 102 (e.g., an inner portion of the substrate layer 102), may be formed in the base substrate 100. In some embodiment, each of the plurality of vertical gate holes VTGH may have a tapered shape where a horizontal width thereof decreases in a direction from an upper side thereof to a lower side thereof (i.e., toward the photo sensing device PD). As used herein, "a horizontal width" refers to a width in a horizontal direction.

In some embodiments, a top surface of the photo sensing device PD may be disposed at a first vertical level LV1, and a bottom surface of the vertical gate hole VTGH may be disposed at a second vertical level LV2 which is higher than the first vertical level LV1. The first vertical level LV1 and the second vertical level LV2 may have a separation interval G1 in a vertical direction (a Z direction). For example, the separation interval G1 may be about 50 Å to about 100 Å.

A gate insulation layer 122, covering a portion of a top surface of the semiconductor layer 106 and an inner surface of each of the plurality of vertical gate holes VTGH, may be formed on the base substrate 100, and a gate conductive layer 124 may be formed on the gate insulation layer 122. The gate insulation layer 122 may conformally cover the portion of the top surface of the semiconductor layer 106 and the inner surface of each of the plurality of vertical gate holes VTGH. In some embodiments, the gate insulation layer 122 may have a uniform thickness along the top surface of the semiconductor layer 106 and the inner surface of each of the plurality of vertical gate holes VTGH as illustrated in FIGS. 3A and 3B. For example, the gate insulation layer 122 may be disposed between the base substrate 100 and the gate conductive layer 124. The gate insulation layer 122 may all overlap the gate conductive layer 124 in a vertical direction. The gate insulation layer 122 may have a third thickness T3 which is less than the second thickness T2. For example, the third thickness T3 may be about 30 Å to about 70 Å. In some embodiments, the first thickness T1 and the third thickness T3 may have substantially the same value. The gate conductive layer 124 may fill the plurality of vertical gate holes VTGH.

Portions of the gate conductive layer 124 apart from one another may include a plurality of transfer gates VTG, a reset gate RG, a source follower gate SF, and a selection gate SEL. The plurality of transfer gates VTG may be portions of the gate conductive layer 124, which fill the plurality of vertical gate holes VTGH and are disposed on the gate insulation layer 122. The reset gate RG, the source follower gate SF, and the selection gate SEL may respectively be different portions of the gate conductive layer 124 disposed on a portion of the gate insulation layer 122 covering the top surface of the semiconductor layer 106. At least a portion of the source follower gate SF and a portion of the floating diffusion region FD may overlap each other in the vertical direction (the Z direction).

Herein, a portion of the gate insulation layer 122 covering the top surface of the semiconductor layer 106 may denote a portion, which is a portion other than a covering the inner surface of each of the plurality of vertical gate holes VTGH and is disposed at the same vertical level, of the gate insulation layer 122.

That is, each of the plurality of transfer gates VTG may be a vertical gate which passes through the semiconductor layer 106 and the buried insulation layer 104 and extends to an inner portion of the substrate layer 102, and each of the reset gate RG, the source follower gate SF, and the selection gate SEL may be a planar gate which does not pass through the semiconductor layer 106 and the buried insulation layer 104 and is disposed on a portion of the gate insulation layer 122 covering the top surface of the semiconductor layer 106. In some embodiments, a bottom surface of each of the plurality of transfer gates VTG may be disposed at a vertical level which is lower than a bottom surface of the buried impurity region 110 and higher than a top surface of the photo sensing device PD. A top surface of each of the reset gate RG, the source follower gate SF, and the selection gate SEL may be disposed at a vertical level which is higher than each of the top surface of the buried impurity region 110 and the top surface of the semiconductor layer 106.

Each of the plurality of transfer gates VTG may include a buried portion TGP filling the vertical gate hole VTGH and a cap portion TGC which covers the buried portion TGP and is disposed at an outer portion of the vertical gate hole VTGH. The cap portion TGC of each of the plurality of transfer gates VTG may denote an upper portion of the transfer gate VTG with respect to a top surface of a portion of the gate insulation layer 122 covering the top surface of the semiconductor layer 106, and the buried portion TGP of each of the plurality of transfer gates VTG may denote a lower portion of the transfer gate VTG with respect to the top surface of the portion of the gate insulation layer 122 covering the top surface of the semiconductor layer 106. The buried portion TGP and the cap portion TGC of each of the plurality of transfer gates VTG may be provided as one body. The cap portion TGC of each of the plurality of transfer gates VTG may be disposed at the same vertical level as the reset gate RG, the source follower gate SF, and the selection gate SEL. A horizontal width of the cap portion TGC of each of the plurality of transfer gates VTG may have a value which is greater than that of a maximum horizontal width (i.e., a widest width in a horizontal direction) of the buried portion TGP. The buried portion TGP of each of the plurality of transfer gates VTG may have a tapered shape where a horizontal width thereof narrows in a direction from an upper side thereof to a lower side thereof (i.e., toward the photo sensing device PD). As used herein, "a portion A and a portion B being provided as one body" (or similar language) may mean that there is at least one monolithic layer included in the portions A and B and/or there is at least one layer that is included in the portions A and B, is formed by the same process and includes the same material. Further, one body may have a unitary structure.

A gate spacer 130 may surround a periphery of the gate conductive layer 124. For example, the gate spacer 130 may cover a sidewall of each of the reset gate RG, the source follower gate SF, and the selection gate SEL. For example, the gate spacer 130 may cover a sidewall of a portion of an upper portion of each of the plurality of transfer gates VTG. The gate spacer 130 may include a spacer liner layer, which conformally covers a sidewall of the gate conductive layer 124 and a portion of the gate insulation layer 122 adjacent to the gate conductive layer 124, and a spacer insulation layer 134 which covers the spacer liner layer 132. For example, the spacer liner layer 132 may include oxide, and the spacer insulation layer 134 may include nitride. In some embodiments, the spacer liner layer 132 may include silicon oxide, and the spacer insulation layer 134 may include silicon nitride. The gate spacer 130 may be disposed at a higher vertical level than that of a portion of the gate insulation layer 122 which does not extend to an inner portion of each of the plurality of transfer gates VTG and covers the top surface of the semiconductor layer 106.

The plurality of impurity regions 142, 144, 146, and 148 may be disposed in the semiconductor layer 106, at sides of the selection gate SEL, the reset gate RG, and the source follower gate SF. Each of the plurality of impurity regions 142, 144, 146, and 148 may be an impurity region having the second conductive type. For example, each of the plurality of impurity regions 142, 144, 146, and 148 may be an n-type impurity region. The plurality of impurity regions 142, 144, 146, and 148 may include a first impurity region 142, a second impurity region 144, a third impurity region 146, and a fourth impurity region 148. For example, in the first horizontal direction (the X direction), the first impurity region 142 and the second impurity region 144 may be disposed at respective opposing sides of the selection gate SEL, the second impurity region 144 and the third impurity region 146 may be disposed at respective opposing sides of the source follower gate SF, and the third impurity region 146 and the fourth impurity region 148 may be disposed at respective opposing sides of the reset gate RG.

A wiring structure 160 may be formed on the gate conductive layer 124 and the gate spacer 130. The wiring structure 160 may be formed on the first surface 102a of the substrate layer 102. The wiring structure 160 may include, for example, a plurality of wirings 162, a plurality of contacts 164, and an interlayer insulation layer 166. In some embodiments, the plurality of wirings 162 included in the wiring structure 160 may have a multi-layer structure. The plurality of contacts 164 may be electrically connected to at least some of the plurality of impurity regions 142, 144, 146, and 148 and the buried impurity region 110. Although not separately shown, the plurality of contacts 164 may be connected to some of the plurality of wirings 162, or may vertically connect the plurality of wirings 162.

The plurality of wirings 162 and the plurality of contacts 164 may have a three-dimensional (3D) connection relationship in the wiring structure 160, and thus, only some of the plurality of wirings 162 and the plurality of contacts 164 are illustrated for example. In FIGS. 3A and 3B, it is illustrated that the plurality of wirings 162 are not connected to the plurality of contacts 164, but some of the plurality of wirings 162 may be connected to one another or some of the plurality of wirings 162 may be connected to some of the plurality of contacts 164.

An output voltage Vout may be provided to a contact 164, connected to the first impurity region 142, of the plurality of contacts 164, and a source voltage Vpix may be provided to a contact 164, connected to the third impurity region 146, of the plurality of contacts 164. A contact 164, connected to the buried impurity region 110, of the plurality of contacts 164, a contact 164, connected to the fourth impurity region 148, of the plurality of contacts 164, and the source follower gate SF may be electrically connected to each other as illustrated in FIG. 2.

A plurality of color filter layers 190 where at least a portion thereof overlaps the plurality of photo sensing devices PD corresponding thereto and a plurality of microlenses 195 disposed on the plurality of color filter layers 190 may be formed on the second surface 102b of the substrate 102.

The image sensor 10 according to some embodiments of the present inventive concept may include the source follower gate SF disposed on the base substrate 100 having an SOI structure. Therefore, a pixel size of the image sensor 10 may decrease, and thus, despite a reduction in width of the source follower gate SF, a short channel effect may be reduced or may be prevented from occurring in a source follower transistor (SFT of FIG. 1) configured by the source follower gate SF, thereby enhancing a transconductance (gm).

The image sensor 10 according to some embodiments of the present inventive concept may include the floating diffusion region FD, which is formed in the substrate layer 102 in the base substrate 100 having the SOI structure and includes the buried impurity region 110, and a transfer gate VTG which is disposed between the photo sensing device PD and the floating diffusion region FD and is a vertical gate. The transfer gate VTG which is a vertical gate may extend to an inner portion of the substrate layer 102 between a top surface of the photo sensing device PD and a bottom surface of the floating diffusion region FD including the buried impurity region 110. Therefore, although the image sensor 10 includes the base substrate 100 having the SOI structure, an electrical charge may be easily transferred between the photo sensing device PD and the floating diffusion region FD, and thus, the light detection performance of the image sensor 10 may be enhanced.

In some embodiments, the image sensor 10 according to some embodiments of the present inventive concept may operate as a double gate where the floating diffusion region FD and the source follower gate SF perform a gate function of each source follower transistor (SFT of FIG. 1) under and on the semiconductor layer 106, and thus, a transconductance of each source follower transistor (SFT of FIG. 1) may be enhanced.

Figure 4A:
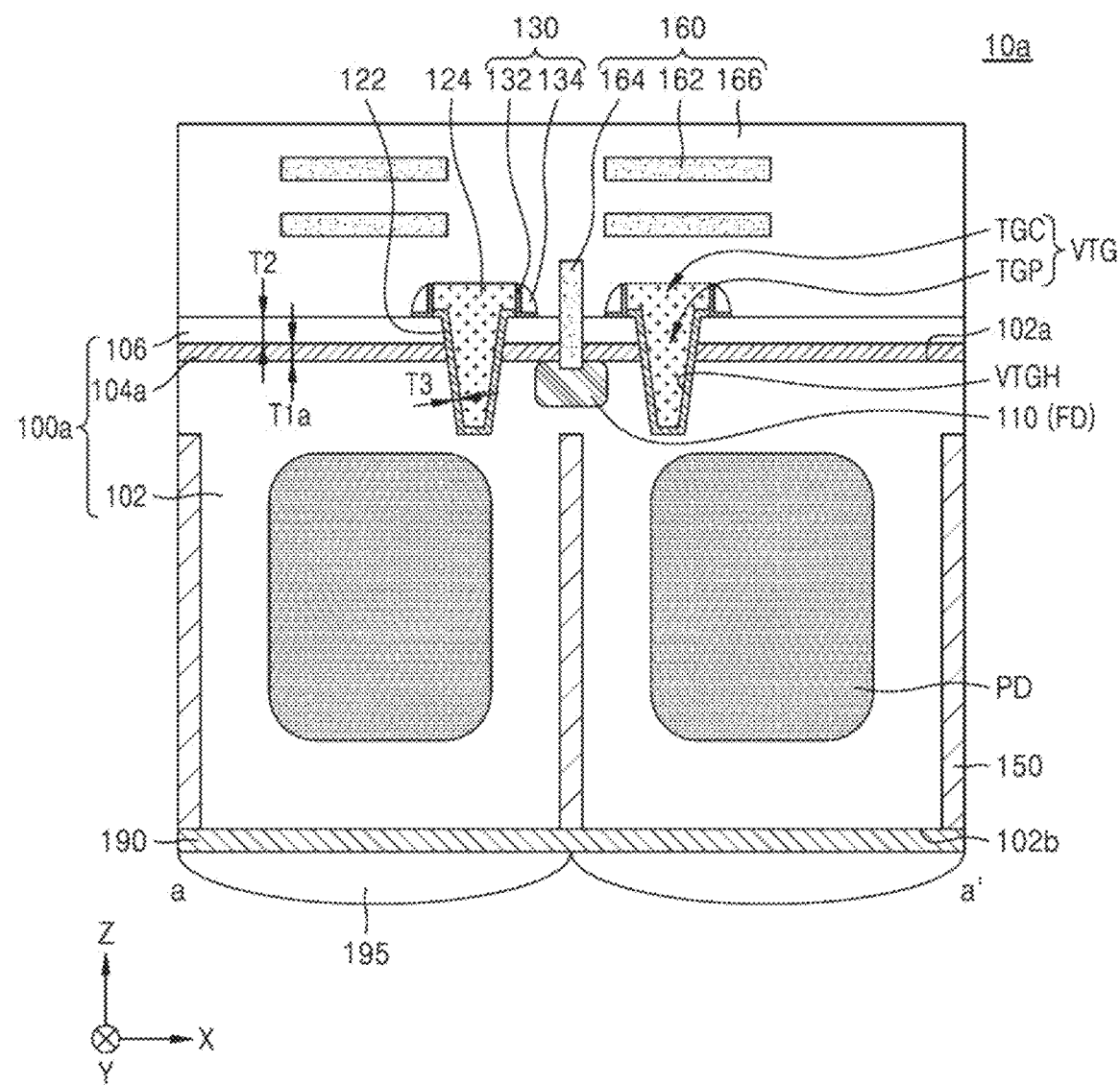
FIGS. 4A and 4B are cross-sectional views of an image sensor according to some embodiments of the present inventive concept.
Figure 4B:
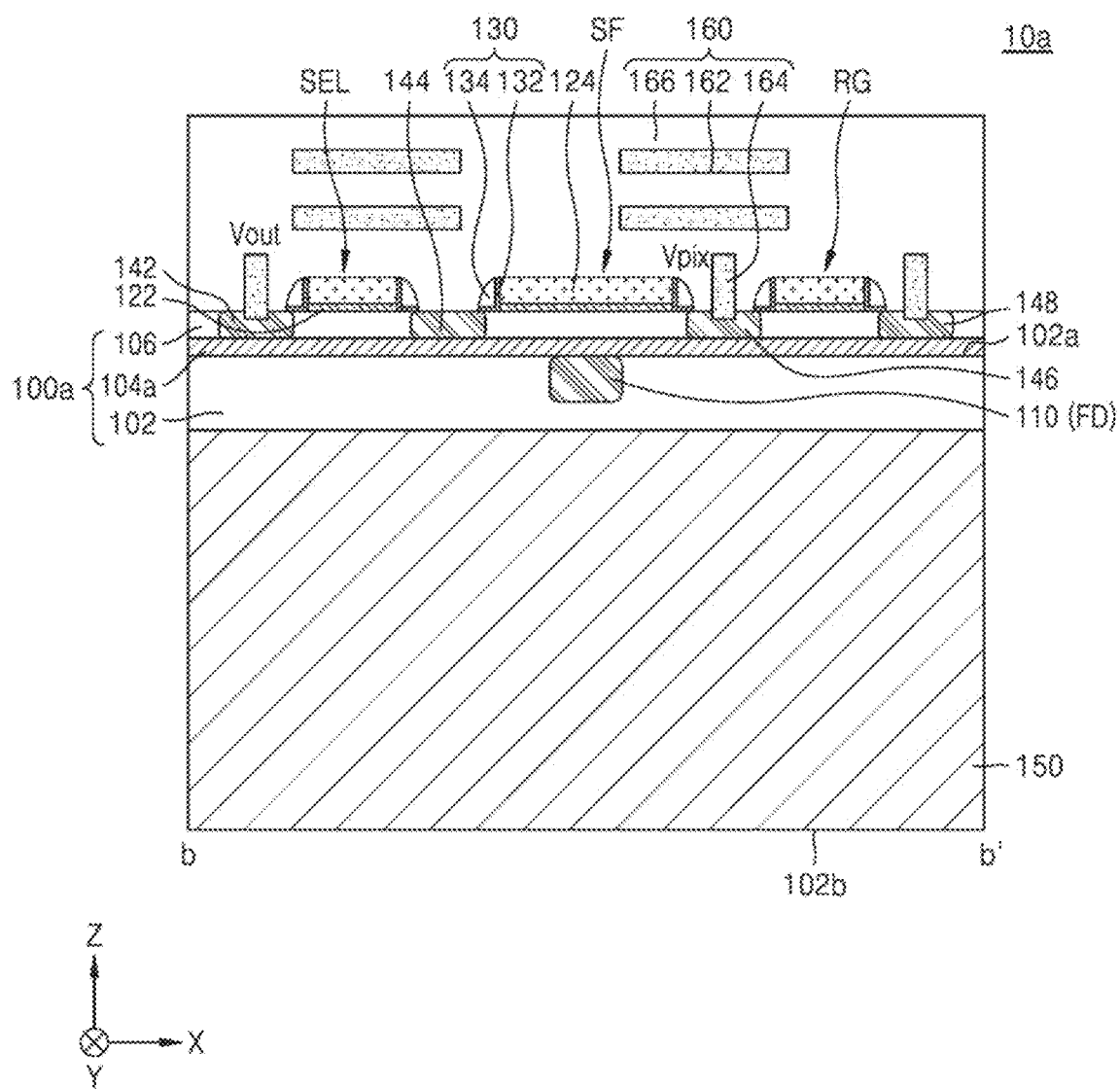

FIGS. 4A and 4B are cross-sectional views of an image sensor 10a according to some embodiments of the present inventive concept. In detail, FIGS. 4A and 4B are cross-sectional views taken along portions corresponding to lines a-a' and b-b' of FIG. 2.

Referring to FIGS. 4A and 4B, the image sensor 10a may include a base substrate 100a which includes a substrate layer 102, a buried insulation layer 104a, and a semiconductor layer 106.

The base substrate 100 may include an SOI substrate. The substrate layer 102 may include a first surface 102a and a second surface 102b, which are opposite to each other. The buried insulation layer 104a may be disposed between the substrate layer 102 and the semiconductor layer 106. The buried insulation layer 104a may cover the first surface 102a of the substrate layer 102.

A plurality of vertical gate holes VTGH, which pass through the semiconductor layer 106 and the buried insulation layer 104a and extend to an inner portion of the substrate layer 102, may be formed in the base substrate 100a. A gate insulation layer 122, covering a portion of a top surface of the semiconductor layer 106 and an inner surface of each of the plurality of vertical gate holes VTGH, may be formed on the base substrate 100, and a gate conductive layer 124 may be formed on the gate insulation layer 122.

The buried insulation layer 104a may have a first thickness T1a. For example, the first thickness T1a may be about 150 Å to about 250 Å. The semiconductor layer 106 may have a second thickness T2 which is greater than the first thickness T1a. For example, the second thickness T2 may be about 300 Å to about 700 Å. The gate insulation layer 122 may have a third thickness T3 which is less than each of the first thickness T1a and the second thickness T2. For example, the third thickness T3 may be about 30 Å to about 70 Å.

The image sensor 10a according to some embodiments of the present inventive concept may include a source follower gate SF, disposed on the semiconductor layer 106 of the base substrate 100a where the substrate layer 102, the buried insulation layer 104a, and the semiconductor layer 106 configure an SOI structure, and a floating diffusion region FD which is electrically connected to the source follower gate SF and is formed in the substrate layer 102, and thus, the buried insulation layer 104a may be disposed between the source follower gate SF and the floating diffusion region FD.

Therefore, despite a reduction in width of the source follower gate SF, a short channel effect may be reduced or may be prevented from occurring in a source follower transistor (SFT of FIG. 1) configured by the source follower gate SF, thereby enhancing a transconductance.

Also, in the image sensor 10a according to some embodiments of the present inventive concept, each of the vertical gate holes VTGH may extend to an inner portion of the substrate layer 102 between a top surface of the photo sensing device PD and a bottom surface of the buried impurity region 110, and thus, the light detection performance of the image sensor 10a may be enhanced.

Figure 5A:
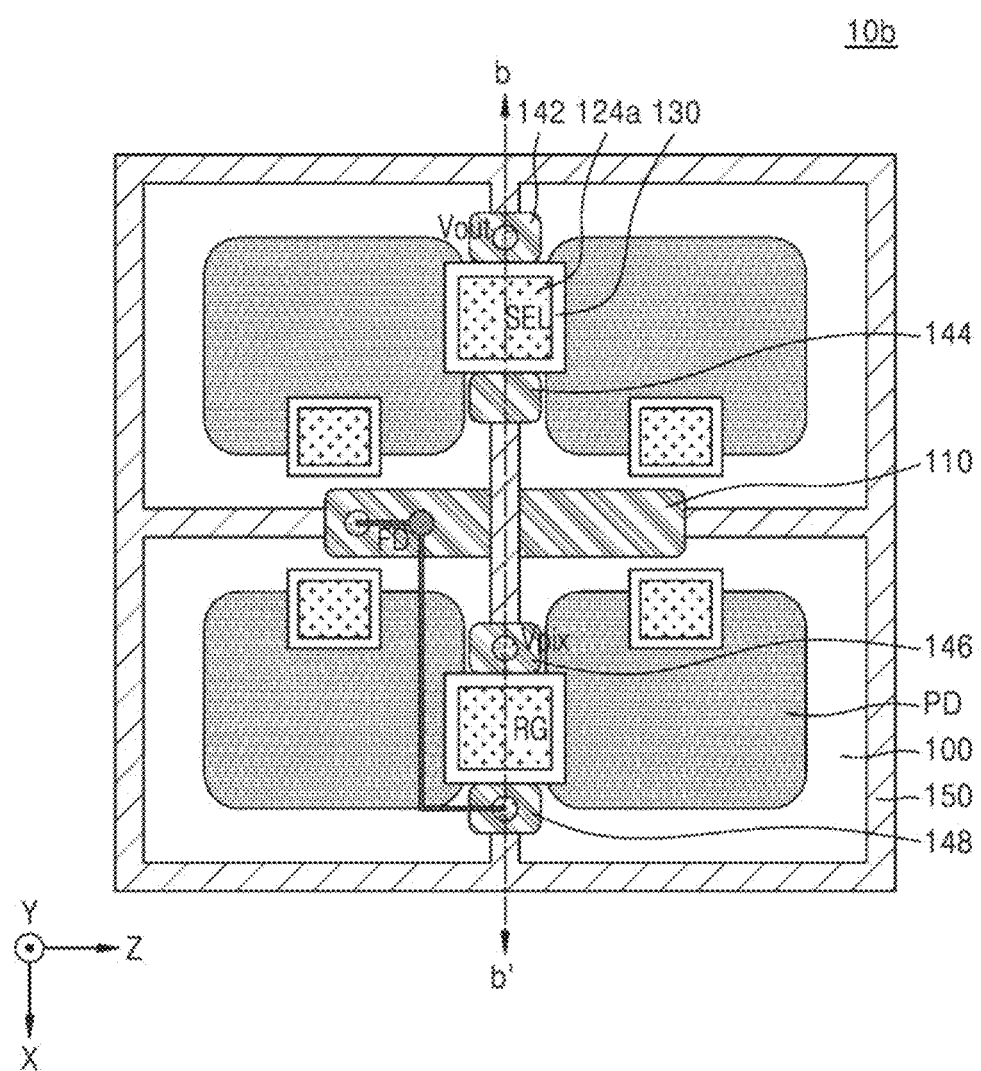
FIG. 5A is a plan layout of a main portion of an image sensor according to some embodiments of the present inventive concept.
Figure 5B:
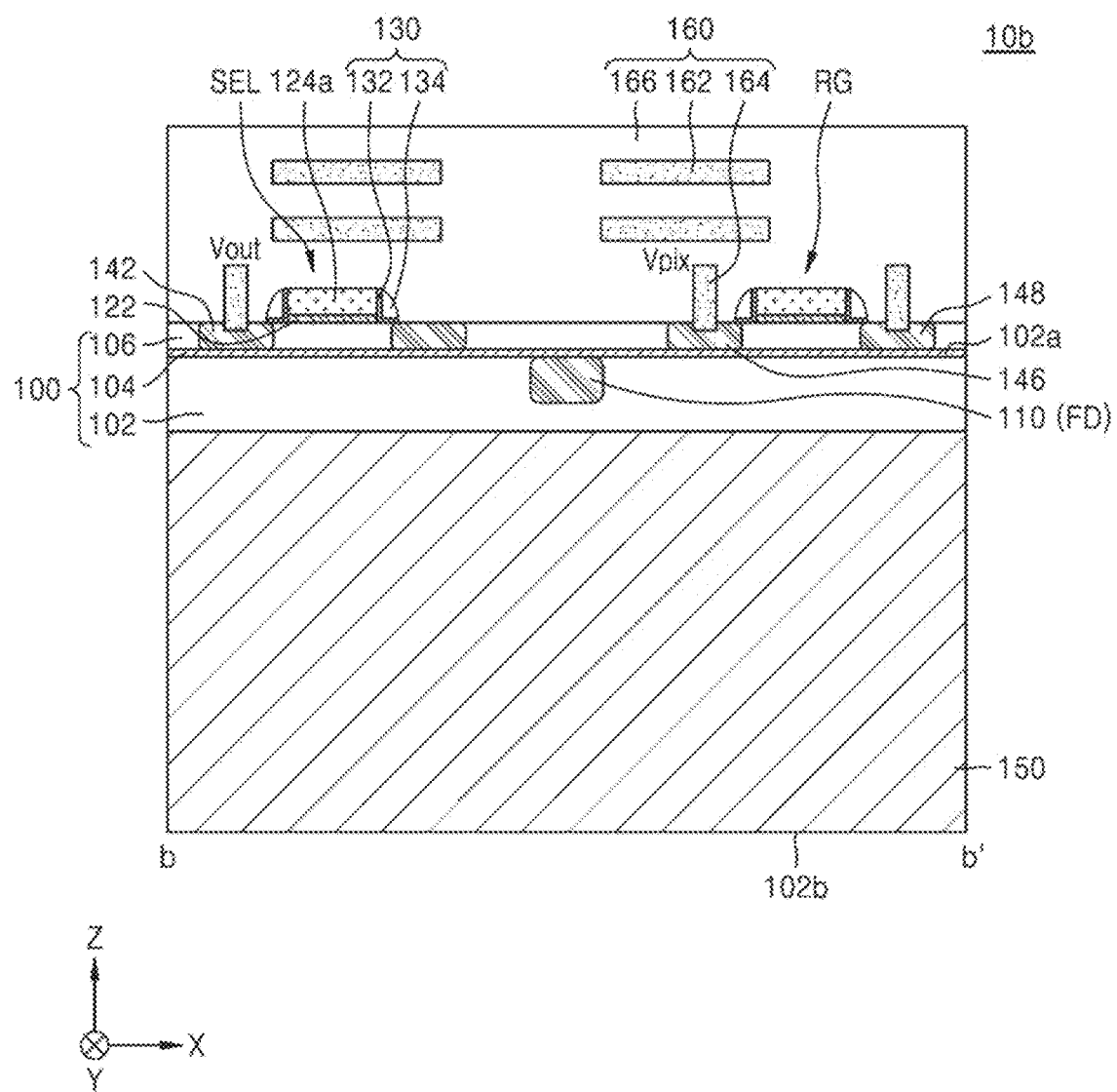
FIG. 5B is a cross-sectional view of an image sensor according to some embodiments of the present inventive concept.

FIG. 5A is a plan layout of a main portion of an image sensor 10b according to some embodiments of the present inventive concept, and FIG. 5B is a cross-sectional view of an image sensor according to some embodiments of the present inventive concept. In detail, FIG. 5B is a cross-sectional view taken along portions corresponding to line b-b' of FIG. 5A.

Referring to FIGS. 5A and 5B, the image sensor 10b may include a base substrate 100 which includes a substrate layer 102, a buried insulation layer 104, and a semiconductor layer 106. The buried insulation layer 104 may have a first thickness T1 (e.g., the first thickness T1 in FIG. 3A). For example, the first thickness T1 may be about 30 Å to about 70 Å. The semiconductor layer 106 may have a second thickness T2 (e.g., the second thickness T2 in FIG. 3A) which is greater than the first thickness T1. For example, the second thickness T2 may be about 300 Å to about 700 Å.

The plurality of photo sensing devices PD may be formed apart from one another and adjacent to a first surface 102a of the substrate layer 102, in the substrate layer 102. A pixel separation region 150 may surround each of the plurality of photo sensing devices PD, in the substrate layer 102. A buried impurity region 110 may be formed at an upper portion (i.e., a portion adjacent to the first surface 102a) of the substrate layer 102.

A plurality of vertical gate holes VTGH, which pass through the semiconductor layer 106 and the buried insulation layer 104 and extend to an inner portion of the substrate layer 102, may be formed in the base substrate 100. A gate insulation layer 122, covering a portion of a top surface of the semiconductor layer 106 and an inner surface of each of the plurality of vertical gate holes VTGH, may be formed on the base substrate 100, and a gate conductive layer 124a may be formed on the gate insulation layer 122. The gate insulation layer 122 may have a third thickness T3 (e.g., the third thickness T3 in FIG. 3A) which is less than the second thickness T2. For example, the third thickness T3 may be about 30 Å to about 70 Å. In some embodiments, the first thickness T1 and the third thickness T3 may have substantially the same value. The gate conductive layer 124a may fill the plurality of vertical gate holes VTGH.

Portions of the gate conductive layer 124a apart from one another may include a plurality of transfer gates VTG, a reset gate RG, and a selection gate SEL. The plurality of transfer gates VTG may be portions of the gate conductive layer 124a, which fill the plurality of vertical gate holes VTGH and are disposed on the gate insulation layer 122. The reset gate RG and the selection gate SEL may respectively be different portions of the gate conductive layer 124a disposed on a portion of the gate insulation layer 122 covering the top surface of the semiconductor layer 106.

The image sensor 10b illustrated in FIGS. 5A and 5B may not include a separate source follower gate SF unlike the image sensor 10 illustrated in FIGS. 2, 3A, and 3B and the buried impurity region 110 which is the floating diffusion region FD may perform a function of the source follower gate SF. Therefore, in the image sensor 10b according to some embodiments of the present inventive concept, despite a reduction in a pixel size, a width of at least one of the transfer gate VTG, the reset gate RG, and the selection gate SEL may be sufficiently secured, and thus, a transconductance of a gate of at least one of a transfer transistor (TT of FIG. 1), a reset transistor (RT of FIG. 1), and a selection transistor (SEL of FIG. 1) may be enhanced.

Figure 6:
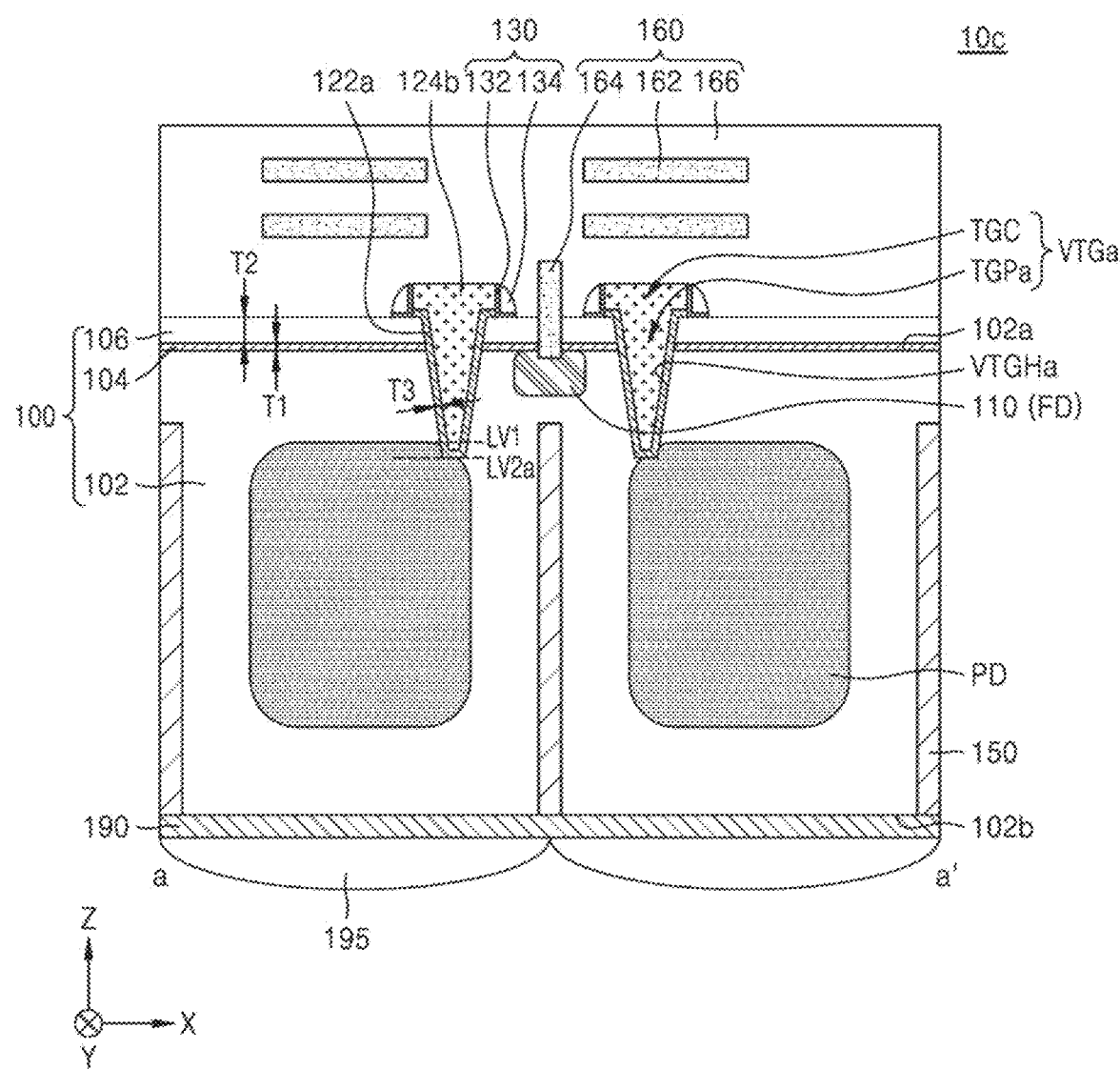
FIG. 6 is a cross-sectional view of an image sensor according to some embodiments of the present inventive concept.

FIG. 6 is a cross-sectional view of an image sensor 10c according to some embodiments of the present inventive concept. In detail, FIG. 6 is a cross-sectional view taken along a portion corresponding to line a-a' of FIG. 2 and a cross-sectional view taken along a portion corresponding to line b-b' of FIG. 2 may be substantially the same as FIG. 3B, and thus, repeated descriptions may be omitted.

Referring to FIGS. 6 and 3B, the image sensor 10c may include a base substrate 100 which includes a substrate layer 102, a buried insulation layer 104, and a semiconductor layer 106. The substrate layer 102 may include a first surface 102a and a second surface 102b, which are opposite to each other. The buried insulation layer 104 may be disposed between the substrate layer 102 and the semiconductor layer 106. The buried insulation layer 104 may cover the first surface 102a of the substrate layer 102.

A plurality of photo sensing devices PD may be formed apart from one another and adjacent to the first surface 102a of the substrate layer 102, in the substrate layer 102. A pixel separation region 150 may surround each of the plurality of photo sensing devices PD, in the substrate layer 102. A buried impurity region 110 may be formed at an upper portion (i.e., a portion adjacent to the first surface 102a) of the substrate layer 102.

A plurality of vertical gate holes VTGHa, which pass through the semiconductor layer 106 and the buried insulation layer 104 and extend to an inner portion of the substrate layer 102, may be formed in the base substrate 100. The plurality of vertical gate holes VTGHa may extend to inner portions of the plurality of photo sensing devices PD. In some embodiments, a top surface of the photo sensing device PD may be disposed at a first vertical level LV1, and a bottom surface of the vertical gate hole VTGHa may be disposed at a second vertical level LV2a which is lower than the first vertical level LV1. As used herein, a top surface of an element refers to a surface faces the same direction that the first surface 102a of the substrate layer 102 faces.

A gate insulation layer 122a, covering a portion of a top surface of the semiconductor layer 106 and an inner surface of each of the plurality of vertical gate holes VTGHa, may be formed on the base substrate 100, and a gate conductive layer 124b may be formed on the gate insulation layer 122a. The gate insulation layer 122a may conformally cover the portion of the top surface of the semiconductor layer 106 and the inner surface of each of the plurality of vertical gate holes VTGHa. A gate conductive layer 124b may fill the plurality of vertical gate holes VTGHa.

Portions of the gate conductive layer 124b apart from one another may include a plurality of transfer gates VTGa, a reset gate RG, a source follower gate SF, and a selection gate SEL. The plurality of transfer gates VTGa may be portions of the gate conductive layer 124b, which fill the plurality of vertical gate holes VTGHa and are disposed on the gate insulation layer 122a.

Each of the plurality of transfer gates VTGa may be a vertical gate which passes through the semiconductor layer 106 and the buried insulation layer 104 and extends to an inner portion of the substrate layer 102, and each of the reset gate the source follower gate SF, and the selection gate SEL may be a planar gate which does not pass through the semiconductor layer 106 and the buried insulation layer 104 and is disposed on a portion of the gate insulation layer 122a covering the top surface of the semiconductor layer 106. In some embodiments, each of the plurality of transfer gates VTGa may pass through the semiconductor layer 106 and the buried insulation layer 104 and may extend up to the photo sensing device PD of the substrate layer 102.

Each of the plurality of transfer gates VTGa may include a buried portion TGPa filling the vertical gate hole VTGHa and a cap portion TGC which covers the buried portion TGPa and is disposed at an outer portion of the vertical gate hole VTGHa. The cap portion TGC of each of the plurality of transfer gates VTGa may denote an upper portion of the transfer gate VTGa with respect to a top surface of a portion of the gate insulation layer 122a covering the top surface of the semiconductor layer 106, and the buried portion TGPa of each of the plurality of transfer gates VTGa may denote a lower portion of the transfer gate VTGa with respect to the top surface of the portion of the gate insulation layer 122a covering the top surface of the semiconductor layer 106. The buried portion TGPa and the cap portion TGC of each of the plurality of transfer gates VTGa may be provided as one body. The cap portion TGC of each of the plurality of transfer gates VTGa may be disposed at the same vertical level as the reset gate RG, the source follower gate SF, and the selection gate SEL. A horizontal width (e.g., a widest horizontal width) of the cap portion TGC of each of the plurality of transfer gates VTGa may have a value which is greater than that of a maximum horizontal width (i.e., a widest horizontal width) of the buried portion TGPa.

A gate spacer 130 may surround a periphery of the gate conductive layer 124b. For example, the gate spacer 130 may cover a sidewall of each of the reset gate RG, the source follower gate SF, and the selection gate SEL. For example, the gate spacer 130 may cover a sidewall of a portion of an upper portion of each of the plurality of transfer gates VTGa.

The image sensor 10b according to some embodiments of the present inventive concept may include the source follower gate SF disposed on the base substrate 100 having an SOI structure, and thus, a short channel effect may be prevented from occurring in a source follower transistor (SFT of FIG. 1) configured by the source follower gate SF, thereby enhancing a transconductance.

The image sensor 10c according to some embodiments of the present inventive concept may include the floating diffusion region FD, which is formed in the substrate layer 102 in the base substrate 100 having the SOI structure and includes the buried impurity region 110, and a transfer gate VTGa which is disposed between the photo sensing device PD and the floating diffusion region FD and is a vertical gate. The transfer gate VTGa which is a vertical gate may extend to an inner portion of the substrate layer 102 between a top surface of the photo sensing device PD and a bottom surface of the buried impurity region 110, and the vertical gate hole VTGHa filled by the gate insulation layer 122a and the transfer gate VTGa may extend to an inner portion of the photo sensing device PD. Therefore, although the image sensor 10c includes the base substrate 100 having the SOI structure, an electrical charge may be easily transferred between the photo sensing device PD and the floating diffusion region FD, and thus, the light detection performance of the image sensor 10c may be enhanced.

Figure 7:
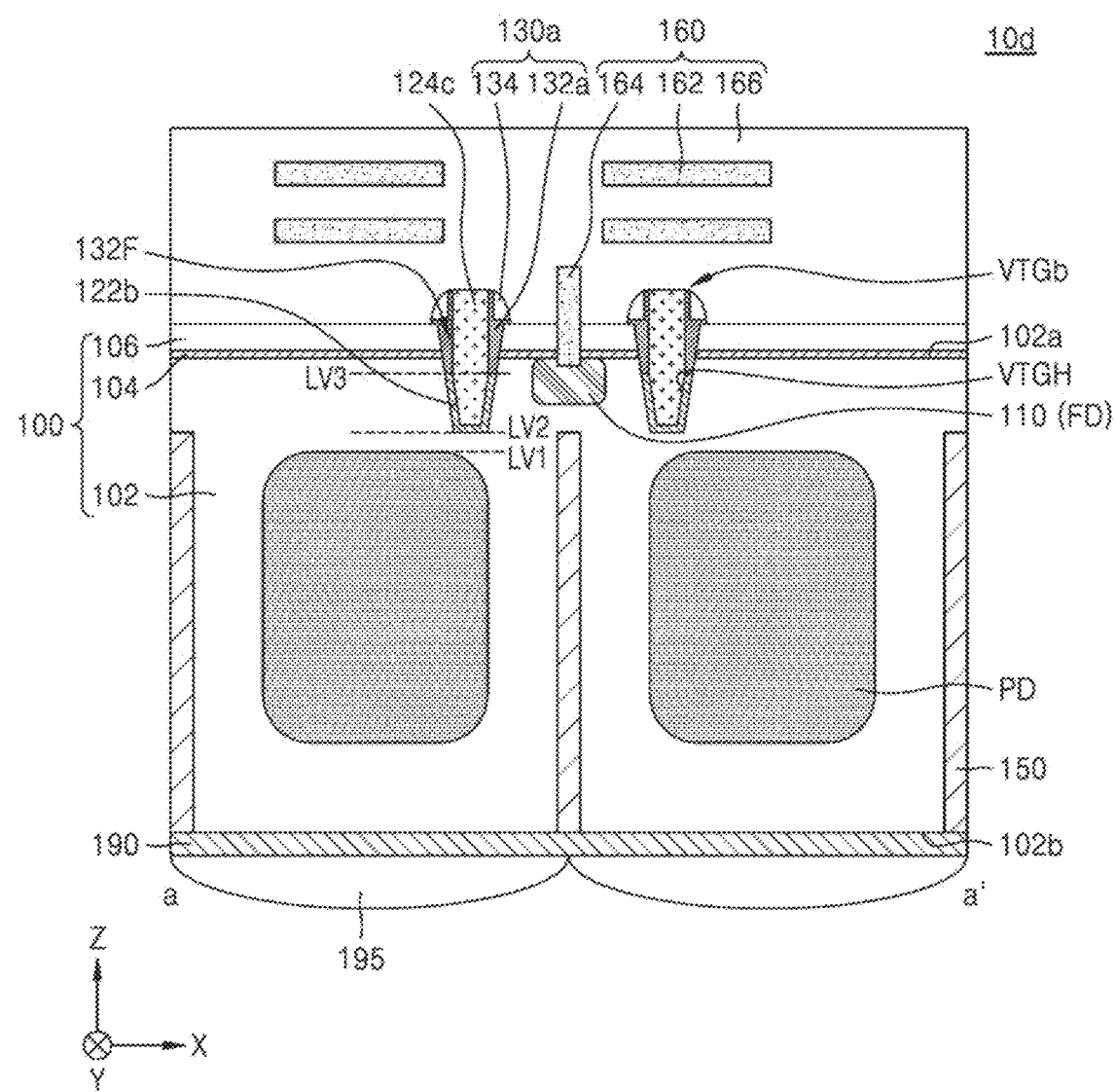
FIG. 7 is a cross-sectional view of an image sensor according to some embodiments of the present inventive concept.

FIG. 7 is a cross-sectional view of an image sensor 10d according to some embodiments of the present inventive concept. In detail, FIG. 7 is a cross-sectional view taken along a portion corresponding to line a-a' of FIG. 2 and a cross-sectional view taken along a portion corresponding to line b-b' of FIG. 2 may be substantially the same as FIG. 3B, and thus, repeated descriptions may be omitted.

Referring to FIGS. 7 and 3B, the image sensor 10d may include a base substrate 100 which includes a substrate layer 102, a buried insulation layer 104, and a semiconductor layer 106. The substrate layer 102 may include a first surface 102a and a second surface 102b, which are opposite to each other. The buried insulation layer 104 may be disposed between the substrate layer 102 and the semiconductor layer 106. The buried insulation layer 104 may cover the first surface 102a of the substrate layer 102.

A plurality of photo sensing devices PD may be formed apart from one another and adjacent to the first surface 102a of the substrate layer 102, in the substrate layer 102. A pixel separation region 150 may surround each of the plurality of photo sensing devices PD, in the substrate layer 102. A buried impurity region 110 may be formed at an upper portion (i.e., a portion adjacent to the first surface 102a) of the substrate layer 102.

A plurality of vertical gate holes VTGH, which pass through the semiconductor layer 106 and the buried insulation layer 104 and extend to an inner portion of the substrate layer 102, may be formed in the base substrate 100. In some embodiments, a top surface of the photo sensing device PD may be disposed at a first vertical level LV1, and a bottom surface of the vertical gate hole VTGH may be disposed at a second vertical level LV2 which is higher than the first vertical level LV1.

A gate insulation layer 122b, covering a portion of a top surface of the semiconductor layer 106 and at least a portion of an inner surface of each of the plurality of vertical gate holes VTGH, may be formed on the base substrate 100, and a gate conductive layer 124c may be formed on the gate insulation layer 122b. The gate insulation layer 122b may conformally cover the portion of the top surface of the semiconductor layer 106 and the at least a portion of the inner surface of each of the plurality of vertical gate holes VTGH. A gate conductive layer 124c may fill a portion of each of the plurality of vertical gate holes VTGH.

Portions of the gate conductive layer 124c apart from one another may include a plurality of transfer gates VTGb, a reset gate RG, a source follower gate SF, and a selection gate SEL. The plurality of transfer gates VTGb may be portions of the gate conductive layer 124c, which fill portions of the plurality of vertical gate holes VTGH and are disposed on the gate insulation layer 122b.

Each of the plurality of transfer gates VTGb may be a vertical gate which passes through the semiconductor layer 106 and the buried insulation layer 104 and extends to an inner portion of the substrate layer 102, and each of the reset gate RG, the source follower gate SF, and the selection gate SEL may be a planar gate which does not pass through the semiconductor layer 106 and the buried insulation layer 104 and is disposed on a portion of the gate insulation layer 122b covering the top surface of the semiconductor layer 106.

A top surface of each of the plurality of transfer gates VTGb, the reset gate RG, the source follower gate SF, and the selection gate SEL may be disposed at the same vertical level, and a bottom surface of each of the plurality of transfer gates VTGb may be disposed at a vertical level which is lower than a bottom surface of each of the reset gate RG, the source follower gate SF, and the selection gate SEL.

A gate spacer 130a may surround a periphery of the gate conductive layer 124c. For example, the gate spacer 130a may cover a sidewall of each of the reset gate RG, the source follower gate SF, and the selection gate SEL. For example, the gate spacer 130a may cover a sidewall of a portion of an upper portion of each of the plurality of transfer gates VTGb and may extend to an inner portion of each of the plurality of vertical gate holes VTGH. For example, the gate spacer 130a may cover a sidewall of a portion of an upper portion of each of the plurality of transfer gates VTGb and may fill a gap portion (e.g., GP of FIG. 15) which is the other portion of each of the plurality of vertical gate holes VTGH (i.e., a portion, which is not filled by the gate insulation layer 122b and the gate conductive layer 124c, of each of the plurality of vertical gate holes VTGH.

The gate spacer 130a may include a spacer liner layer 132a, which conformally covers a sidewall of the gate conductive layer 124c and a portion of the gate insulation layer 122b adjacent to the gate conductive layer 124c, and a spacer insulation layer 134 which covers the spacer liner layer 132a. In some embodiments, the spacer liner layer 132a may include a filling portion 132F which fills the gap portion (e.g., GP of FIG. 15) of each of the plurality of vertical gate holes VTGH. The gap portion (e.g., GP of FIG. 15) of each of the plurality of vertical gate holes VTGH may be filled by the filling portion 132F of the spacer liner layer 132a.

A lowermost end of the gate spacer 130a may be disposed at a third vertical level LV3 which is higher than the second vertical level LV2. In some embodiments, the third vertical level LV3 may be disposed at a vertical level which is lower than the first surface 102a of the substrate layer 102.

In some embodiments, a portion, which is higher than the third vertical level LV3, of each of the plurality of transfer gates VTGb may have substantially the same horizontal width along a vertical direction (a Z direction), and a portion, which is lower than the third vertical level LV3, of each of the plurality of transfer gates VTGb may have a tapered shape where a horizontal width thereof narrows in a direction from an upper side thereof to a lower side thereof. For example, the gate spacer 130a may cover a sidewall of a portion, which is higher than the third vertical level LV3, of each of the plurality of transfer gates VTGb.

In the image sensor 10d according to some embodiments of the present inventive concept, a horizontal width of the transfer gate VTGb may have a relatively small value, and thus, a parasitic capacitance occurring due to the transfer gate VTGb may be reduced or minimized, thereby enhancing an operation characteristic of the image sensor 10d.

FIGS. 8A to 13B are cross-sectional views illustrating a method of manufacturing an image sensor, according to some embodiments of the present inventive concept. In detail, FIGS. 8A to 13B are cross-sectional views illustrating a method of manufacturing the image sensor 10 illustrated in FIGS. 2, 3A, and 3B, FIGS. 8A, 9A, 10A, 11A, 12A, and 13A are cross-sectional views taken along a portion corresponding to line a-a' of FIG. 2, and FIGS. 8B, 9B, 10B, 11B, 12B, and 13B are cross-sectional views taken along a portion corresponding to line b-b' of FIG. 2.

Figure 8A:
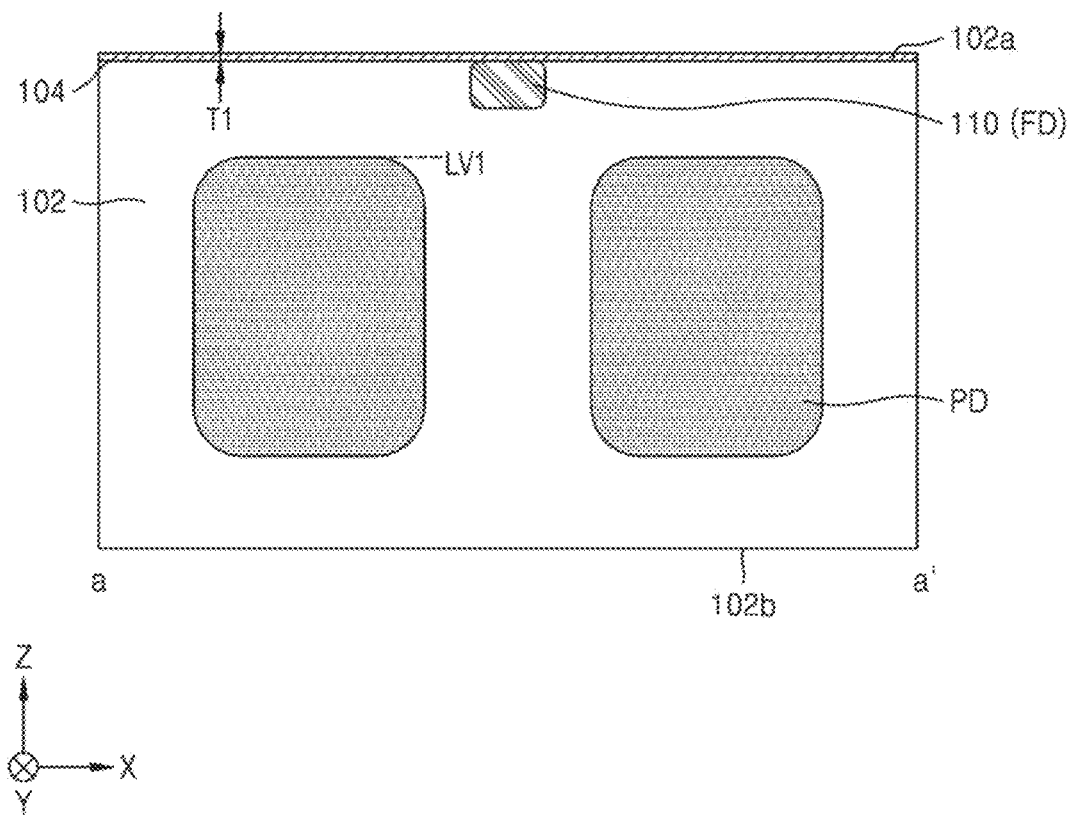
FIGS. 8A, 8B, 9A, 9B, 10A, 10B, 11A, 11B, 12A, 12B, 13A and 13B are cross-sectional views illustrating a method of manufacturing an image sensor, according to some embodiments of the present inventive concept.
Figure 8B:
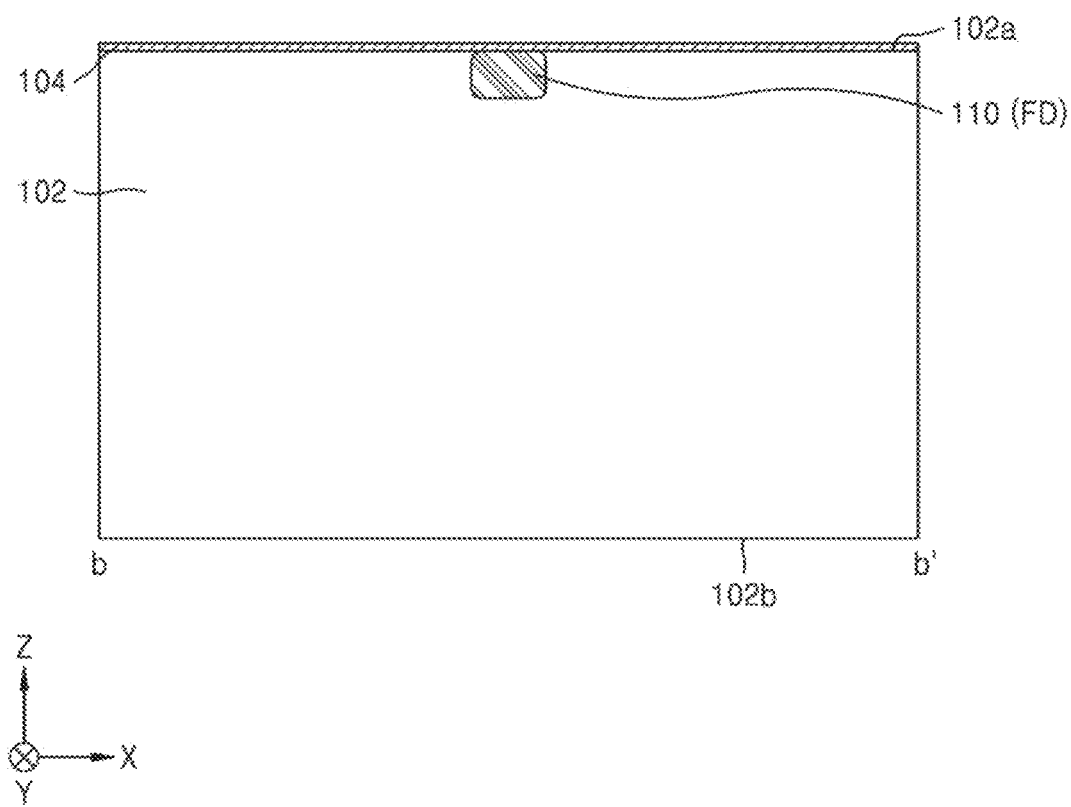

Referring to FIGS. 8A and 8B, a substrate layer 102 including a first surface 102a and a second surface 102b which are opposite to each other may be prepared, and then, a buried insulation layer 104 covering the first surface 102a of the substrate layer 102 may be formed. Subsequently, a plurality of photo sensing devices PD and a buried impurity region 110 may be formed in the substrate layer 102. In some embodiments, impurities having the second conductive type may be implanted into the substrate layer 102 by performing an ion implantation process, and thus, the plurality of photo sensing devices PD and the buried impurity region 110 may be formed.

The substrate layer 102 may be formed based on a semiconductor substrate having the first conductive type. In some embodiments, the substrate layer 102 may include a p-type semiconductor substrate. A buried insulation layer 104 may be formed to have a first thickness T1. For example, the first thickness T1 may be about 30 Å to about 70 Å.

The plurality of photo sensing devices PD may be formed adjacent to the first surface 102a of the substrate layer 102 and apart from one another in the substrate layer 102. Each of the photo sensing devices PD may be an impurity region having the second conductive type, which is formed by implanting the impurities having the second conductive type. For example, each of the photo sensing devices PD may be formed as an n-type impurity region.

The buried impurity region 110 may be formed at an upper portion of the substrate layer 102 (i.e., a portion adjacent to the first surface 102a). In some embodiments, the buried impurity region 110 may be formed to extend toward an inner portion of the substrate layer 102 from the first surface 102a of the substrate layer 102. In some embodiments, a top surface of the buried impurity region 110 may be apart from the first surface 102a of the substrate layer 102. The buried impurity region 110 may be an impurity region having the second conductive type, which is formed by implanting the impurities having the second conductive type. For example, the buried impurity region 110 may be formed as an n-type impurity region. A bottom surface of the buried impurity region 110 may be disposed at a vertical level which is higher than a top surface of the photo sensing device PD.

Figure 9A:
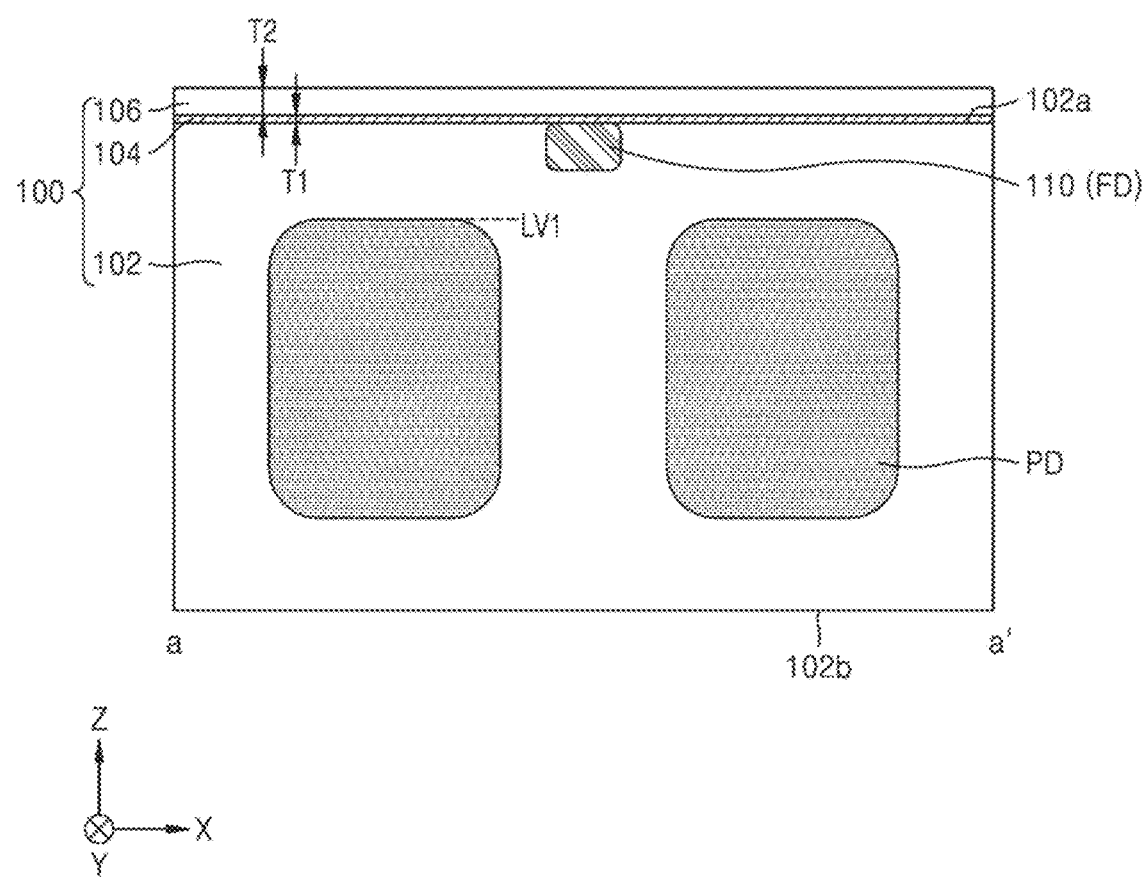
Figure 9B:
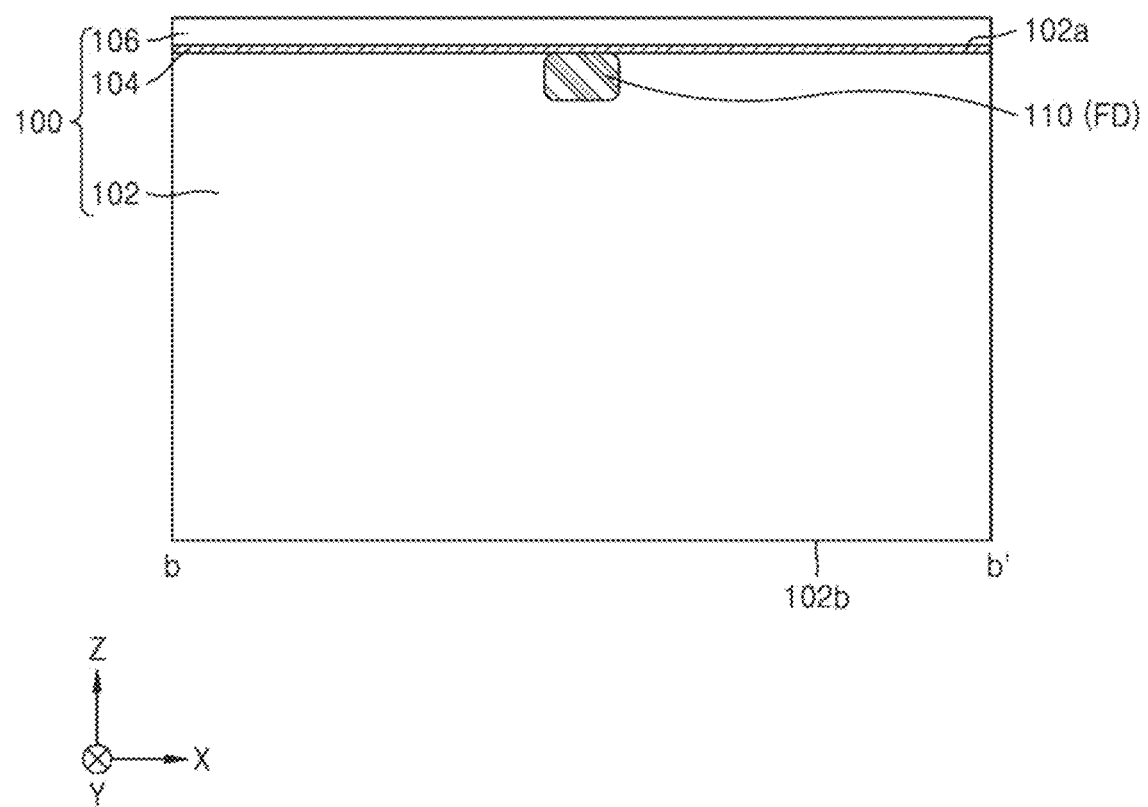

Referring to FIGS. 9A and 9B, a semiconductor layer 106 may be formed on the buried insulation layer 104, and thus, a base substrate 100 including the substrate layer 102, the buried insulation layer 104, and the semiconductor layer 106 may be formed. In some embodiments, the semiconductor layer 106 may be formed on the buried insulation layer 104 through growth and/or deposition. The semiconductor layer 106 may be formed to have a second thickness T2 which is greater than the first thickness T1. For example, the second thickness T2 may be about 300 Å to about 700 Å.

In some embodiments, unlike the descriptions of FIGS. 8A and 8B, the base substrate 100 including the substrate layer 102, the buried insulation layer 104, and the semiconductor layer 106 may be first prepared, and then, the plurality of photo sensing devices PD and the buried impurity region 110 may be formed in the substrate layer 102. For example, the semiconductor layer 106 may be formed by attaching a separately formed semiconductor material layer on the buried insulation layer 104 with the buried insulation layer 104 therebetween.

Figure 10A:
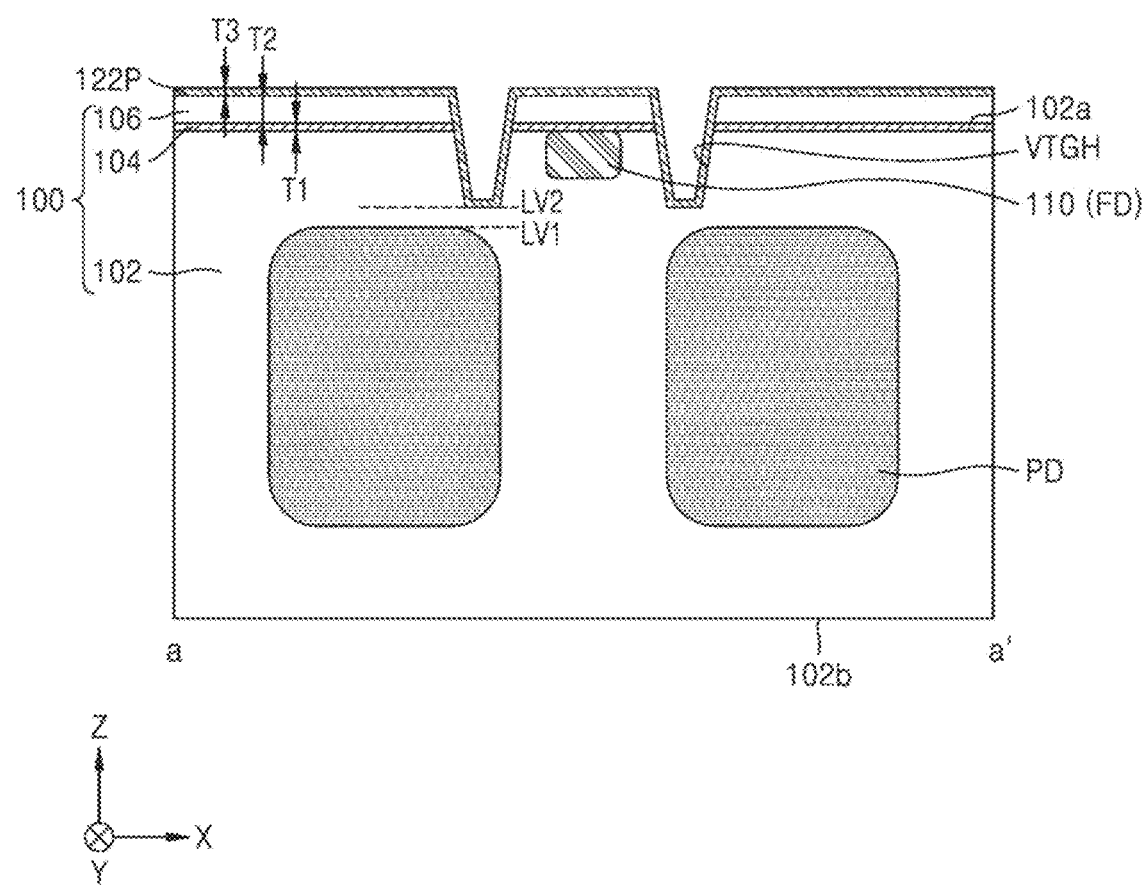
Figure 10B:
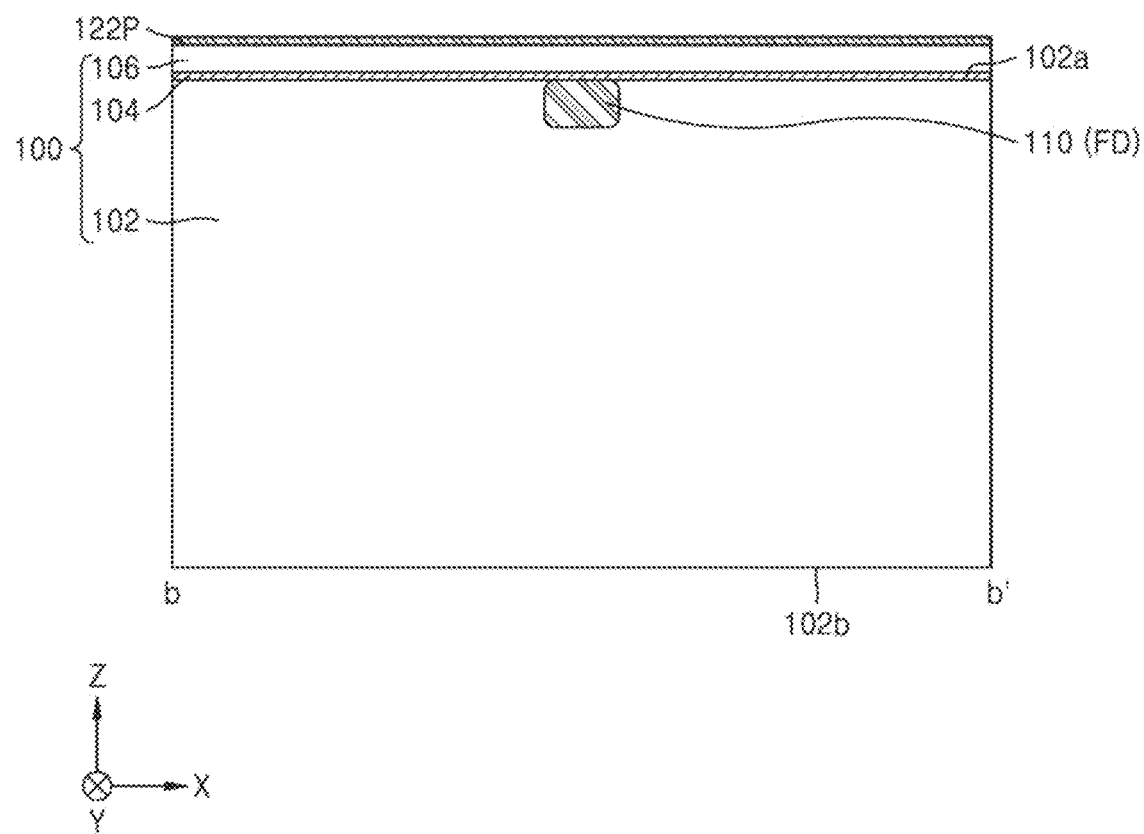
Figure 11A:
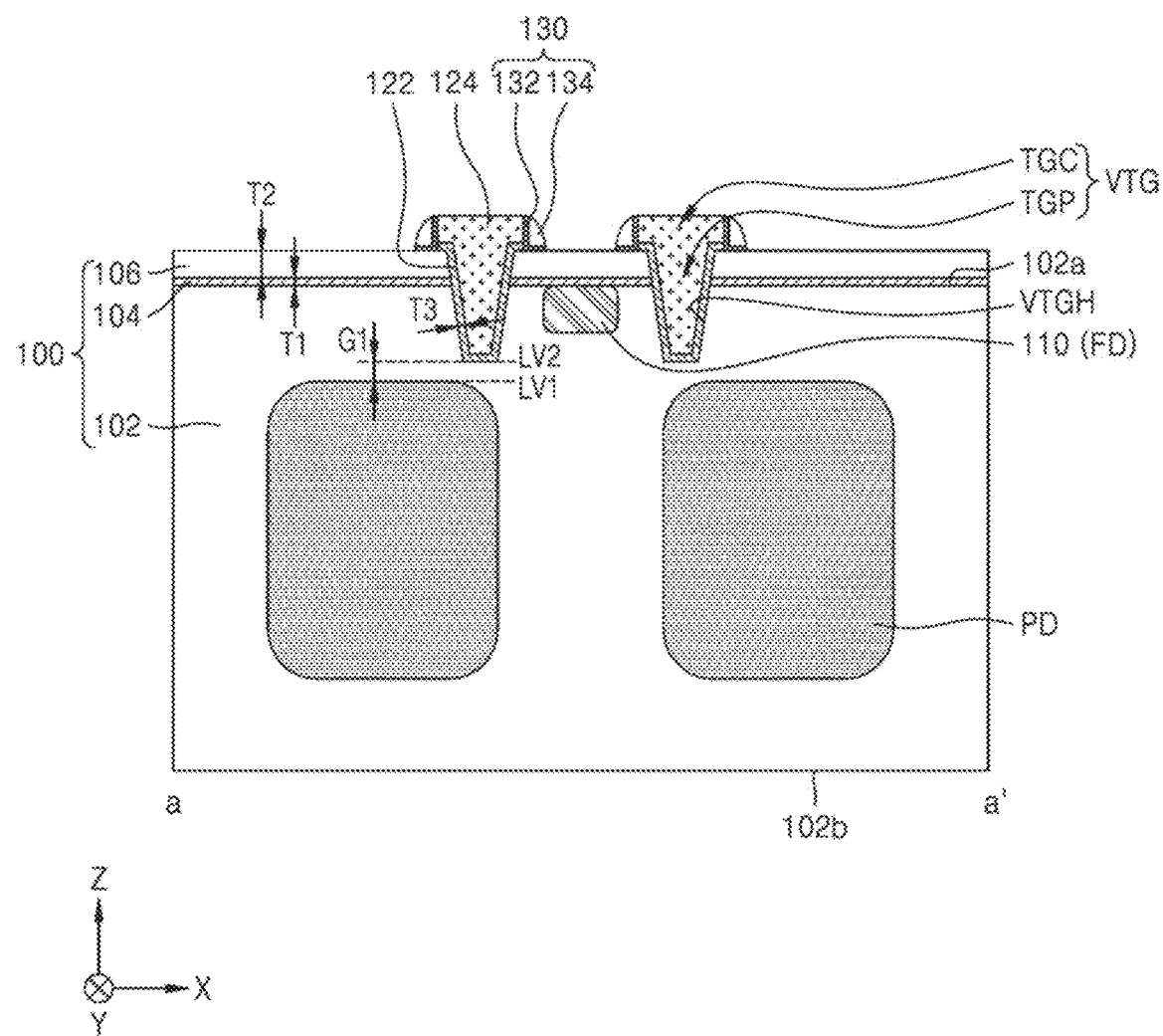
Figure 11B:
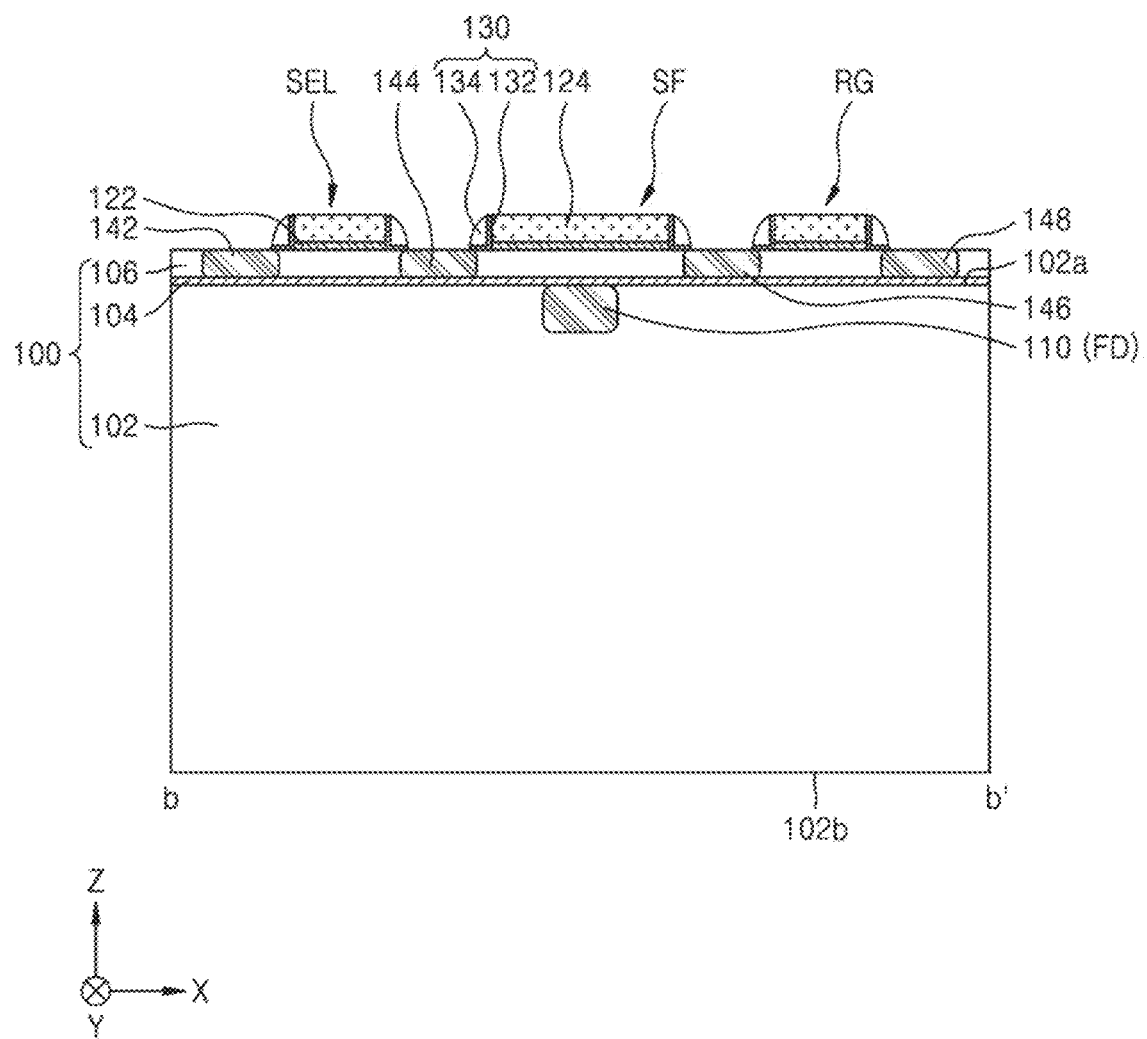

Referring to FIGS. 10A and 10B, a plurality of vertical gate holes VTGH, which pass through the semiconductor layer 106 and the buried insulation layer 104 and extend to an inner portion of the substrate layer 102, may be formed. The plurality of vertical gate holes VTGH may be formed not to extend up to the photo sensing device PD. For example, each of the plurality of vertical gate holes VTGH may be formed so that a bottom surface thereof is disposed at the second vertical level LV2 which is higher than the first vertical level LV1 at which a top surface of the photo sensing device PD is disposed. In some embodiments, the second vertical level LV2 may be about 50 Å to about 100 Å higher than the first vertical level LV1 in a vertical direction (a Z direction).

A preliminary gate insulation layer 122P, covering a top surface of the semiconductor layer 106 and an inner surface of each of the plurality of vertical gate holes VTGH, may be formed on the base substrate 100 where the plurality of vertical gate holes VTGH are formed. The preliminary gate insulation layer 122P may be formed to conformally cover the top surface of the semiconductor layer 106 and the inner surface of each of the plurality of vertical gate holes VTGH. The preliminary gate insulation layer 122P may be formed to have a third thickness T3 which is less than the second thickness T2. For example, the third thickness T3 may be about 30 Å to about 70 Å. In some embodiments, the first thickness T1 and the third thickness T3 may have substantially the same value.

Referring to FIGS. 10A to 11B, a preliminary gate conductive material layer covering the preliminary gate insulation layer 122P and filling the plurality of vertical gate holes VTGH may be formed, and then, a gate conductive layer 124 may be formed by patterning the preliminary gate conductive material layer. The gate conductive layer 124 may include at least one of doped polysilicon, metal, metal silicide, metal nitride, and a metal-containing film.

In some embodiments, in a process of patterning the preliminary gate conductive material layer to form the gate conductive layer 124, only a portion, overlapping the gate conductive layer 124 in the vertical direction (the Z direction), of the preliminary gate insulation layer 122P may remain as the gate insulation layer 122, and the other portion may be removed. For example, the gate insulation layer 122 may be disposed between the base substrate 100 and the gate conductive layer 124. The gate insulation layer 122 may all overlap the gate conductive layer 124 in the vertical direction. In some embodiments, the gate conductive layer 124 overlaps the entirety of the gate insulation layer 122 in the vertical direction.

Portions of the gate conductive layer 124 apart from one another may include a plurality of transfer gates VTG, a reset gate RG, a source follower gate SF, and a selection gate SEL. The plurality of vertical gate holes VTGH may be filled by the plurality of transfer gates VTG. The plurality of transfer gates VTG may be portions of the gate conductive layer 124, which fill the plurality of vertical gate holes VTGH and are disposed on the gate insulation layer 122.

A plurality of impurity regions 142, 144, 146, and 148 may be formed in the semiconductor layer 106, at opposing sides of the selection gate SEL, the source follower gate SF, and the reset gate RG. In some embodiments, the plurality of impurity regions 142, 144, 146, and 148 may each be an impurity region having the second conductive type, which is formed by implanting impurities having the second conductive type into the semiconductor layer 106 through an ion implantation process. For example, the plurality of impurity regions 142, 144, 146, and 148 may each be formed as an n-type impurity region.

The plurality of impurity regions 142, 144, 146, and 148 may include a first impurity region 142, a second impurity region 144, a third impurity region 146, and a fourth impurity region 148. For example, in the first horizontal direction (the X direction), the first impurity region 142 and the second impurity region 144 may be formed in the semiconductor layer 106 at respective opposing sides of the selection gate SEL, the second impurity region 144 and the third impurity region 146 may be formed in the semiconductor layer 106 at respective opposing sides of the source follower gate SF, and the third impurity region 146 and the fourth impurity region 148 may be formed in the semiconductor layer 106 at respective opposing sides of the reset gate RG.

Subsequently, a spacer material layer covering the gate conductive layer 124 may be formed, and then, by removing only a portion of the spacer material layer, a gate spacer 130 surrounding a periphery of the gate conductive layer 124 may be formed. For example, the gate spacer 130 may be formed to cover a sidewall of each of the reset gate RG, the source follower gate SF, and the selection gate SEL. For example, the gate spacer 130 may cover a sidewall of a portion of an upper portion of the transfer gate VTG.

The spacer material layer may include a preliminary liner material layer, which conformally covers the base substrate 100 with the gate conductive layer 124 formed therein, and a preliminary insulation material layer which covers the preliminary liner material layer. For example, the preliminary liner material layer may include oxide, and the preliminary insulation material layer may include nitride. In some embodiments, the liner material layer may include silicon oxide, and the insulation material layer may include silicon nitride. The gate spacer 130 may include a spacer liner layer 132 and a spacer insulation layer 134 which are a portion of the preliminary liner material layer and a portion of the preliminary insulation material layer, respectively. The gate spacer 130 may be disposed at a higher vertical level than that of the semiconductor layer 106 not to extend to an inner portion of each of the plurality of vertical gate holes VTGH.

Figure 12A:
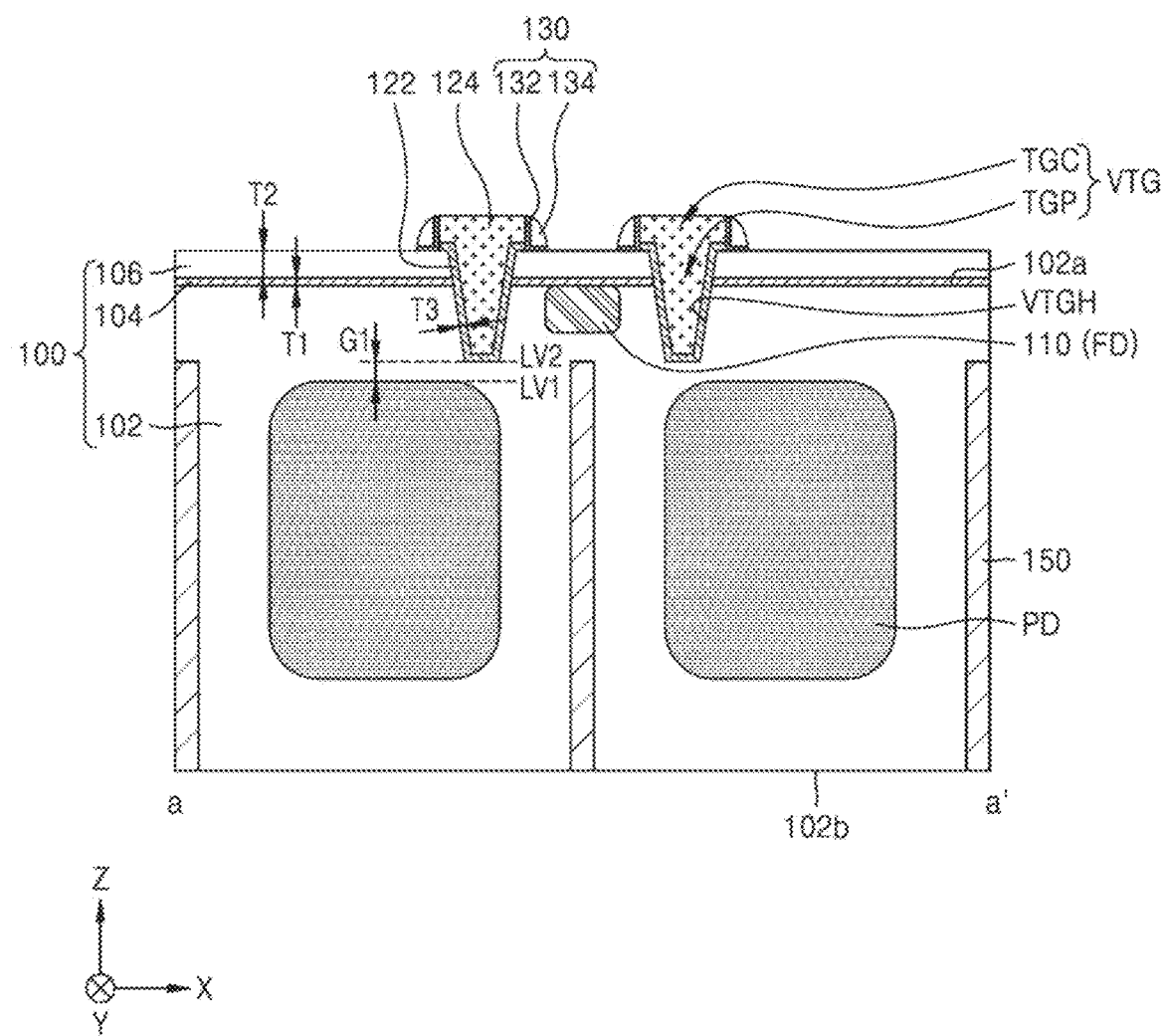
Figure 12B:
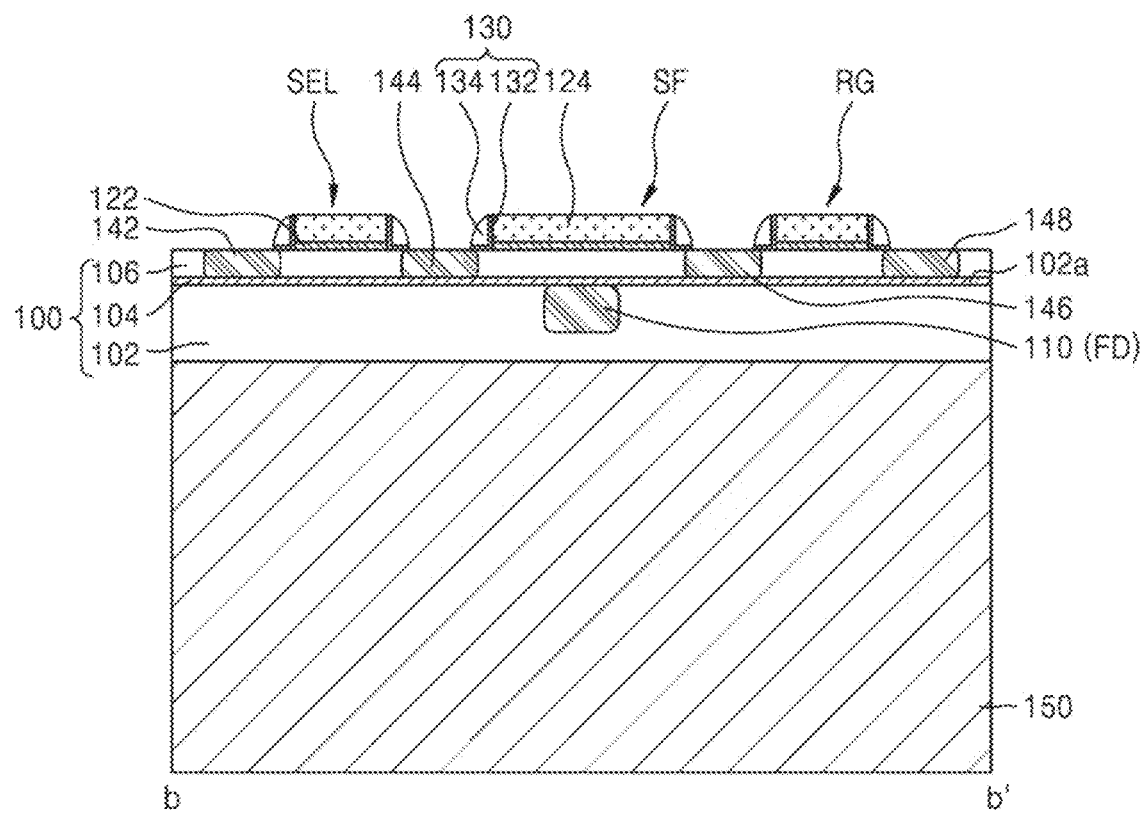

Referring to FIGS. 12A and 12B, a pixel separation region 150 surrounding a periphery of each of the plurality of photo sensing devices PD may be formed. The pixel separation region 150 may be formed to surround the periphery of each of the plurality of photo sensing devices PD, in the substrate layer 102. In some embodiments, a separation recess extending from the second surface 102b of the substrate layer 102 to an inner portion of the substrate layer 102 may be formed, and then, the pixel separation region 150 may be formed by filling a separating material into the separation recess. For example, the pixel separation region 150 may be formed apart from the first surface 102a of the substrate layer 102. The pixel separation region 150 may be formed as, for example, DTI.

In some embodiments, the pixel separation region 150 may include a material having a refractive index which is lower than that of a material included in the substrate layer 102. For example, the pixel separation region 150 may be formed so that oxide or oxynitride is filled into the separation recess or oxide, nitride, or oxynitride is filled into the separation recess, and air is included in the separation recess.

In some embodiments, the pixel separation region 150 may include an insulation liner covering an inner surface of the separation recess and a buried conductive layer which covers the insulation liner and fills the separation recess. For example, the insulation liner may include metal oxide such as hafnium oxide, aluminum oxide, or tantalum oxide, or may include an insulating material such as silicon oxide, silicon nitride, or silicon oxynitride, and the buried conductive layer may include, for example, at least one of doped polysilicon, metal, metal silicide, metal nitride, and a metal-containing film.

Figure 13A:
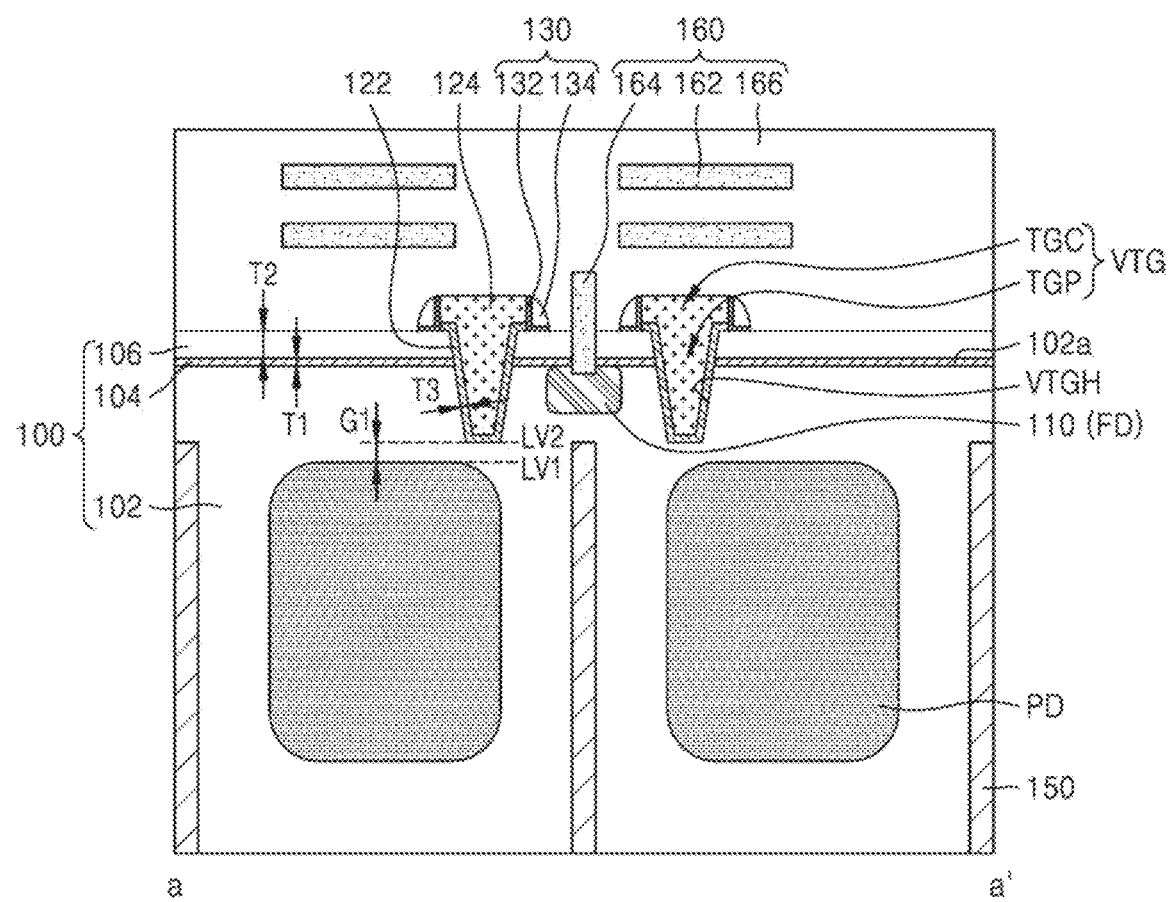
Figure 13B:
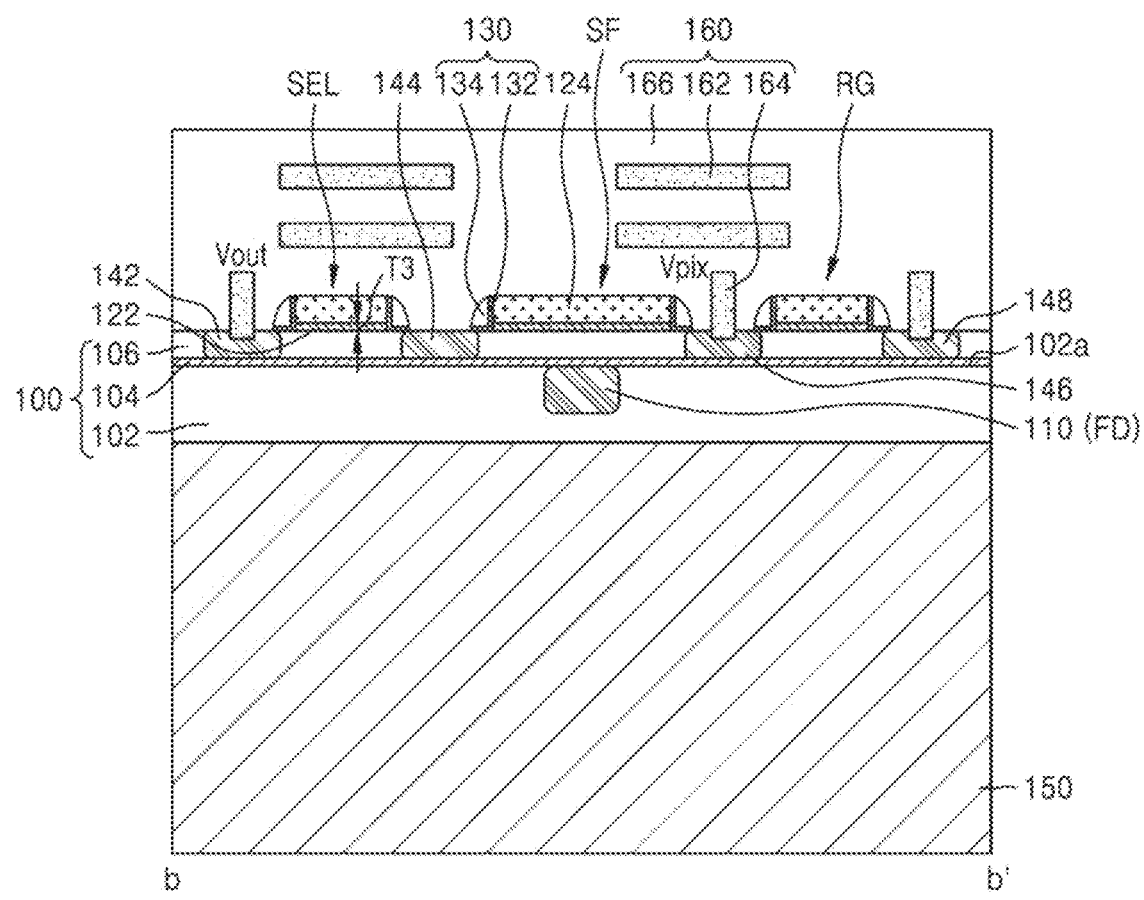

Referring to FIGS. 13A and 13B, a wiring structure 160 where the gate conductive layer 124 and the gate spacer 130 are disposed may be formed on the base substrate 100. The wiring structure 160 may be formed on the first surface 102a of the substrate layer 102. The wiring structure 160 may be formed to include, for example, a plurality of wirings 162, a plurality of contacts 164, and an interlayer insulation layer 166. In some embodiments, the plurality of wirings 162 included in the wiring structure 160 may be formed to have a multi-layer structure. The plurality of contacts 164 may be formed to be electrically connected to at least some of the plurality of impurity regions 142, 144, 146, and 148 and the buried impurity region 110. Although not separately shown, the plurality of contacts 164 may be formed to be connected to some of the plurality of wirings 162 or to vertically connect the plurality of wirings 162.

Subsequently, as illustrated in FIGS. 2 to 3B, a color filter layer 190 where at least a portion thereof overlaps the photo sensing device PD and a micro-lens 195 disposed on the color filter layer 190 may be formed on the second surface 102b of the substrate 102, thereby forming the image sensor 10.

In the image sensor 10a illustrated in FIGS. 4A and 4B, a buried insulation layer 104a having a first thickness T1a may be formed instead of forming the buried insulation layer 104 having the first thickness T1 described in the method of manufacturing the image sensor 10 described above with reference to FIGS. 8A to 13B.

In the image sensor 10B illustrated in FIGS. 5A and 5B, a gate conductive layer 124a may be formed instead of forming the gate conductive layer 124 described in the method of manufacturing the image sensor 10 described above with reference to FIGS. 8A to 13B.

Figure 14:
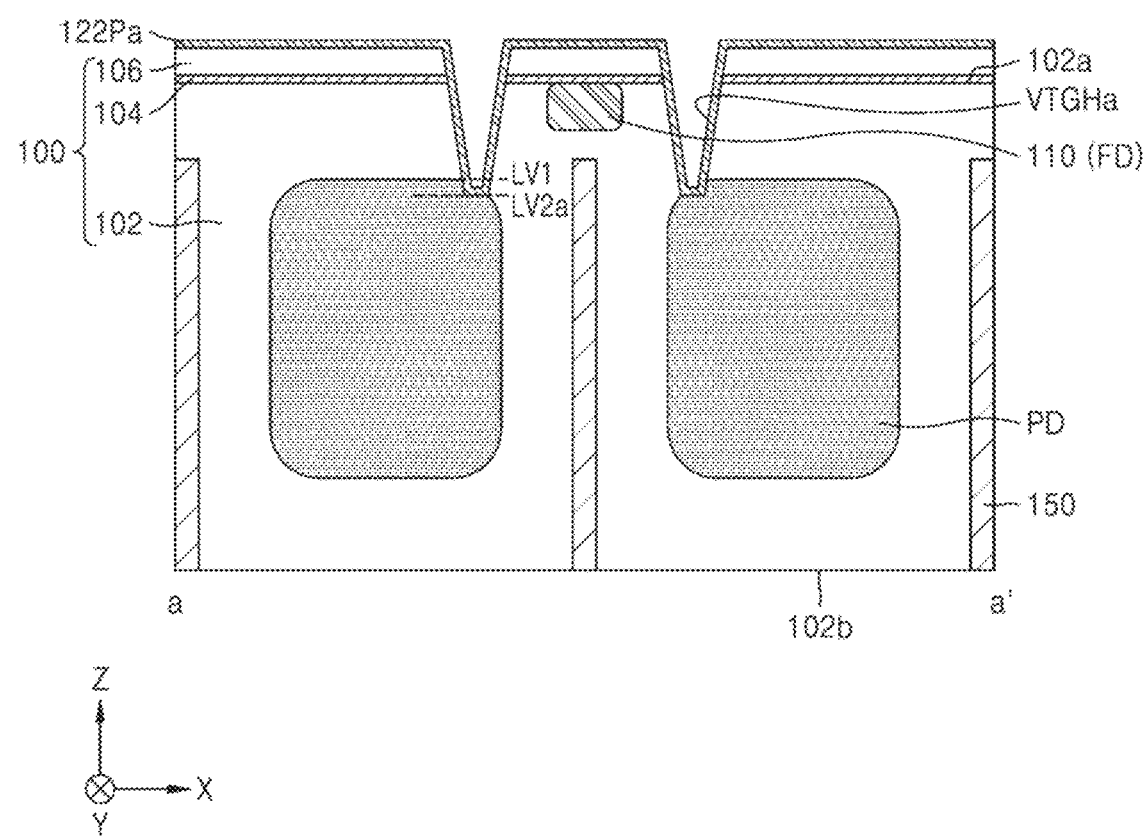
FIG. 14 is a cross-sectional view illustrating a method of manufacturing an image sensor, according to some embodiments of the present inventive concept.

FIG. 14 is a cross-sectional view illustrating a method of manufacturing an image sensor, according to some embodiments of the present inventive concept. In detail, FIG. 14 is a cross-sectional view illustrating a method of manufacturing the image sensor 10c illustrated in FIG. 6, and FIG. 14 is a cross-sectional view taken along a portion corresponding to line a-a' of FIG. 2.

Referring to FIG. 14, a plurality of vertical gate holes VTGHa which pass through the semiconductor layer 106 and the buried insulation layer 104 and extend to an inner portion of the substrate layer 102 may be formed in the base substrate 100. The plurality of vertical gate holes VTGHa may be formed to extend up to the photo sensing device PD. For example, each of the plurality of vertical gate holes VTGHa may be formed so that a bottom surface thereof is disposed at the second vertical level LV2a which is lower than the first vertical level LV1 at which a top surface of the photo sensing device PD is disposed.

A preliminary gate insulation layer 122Pa, covering a top surface of the semiconductor layer 106 and an inner surface of each of the plurality of vertical gate holes VTGHa, may be formed on the base substrate 100 where the plurality of vertical gate holes VTGHa are formed. The preliminary gate insulation layer 122Pa may be formed to conformally cover the top surface of the semiconductor layer 106 and the inner surface of each of the plurality of vertical gate holes VTGHa.

Subsequently, the image sensor 10c illustrated in FIG. 6 may be formed by the manufacturing method described above with reference to FIGS. 11A to 13B.

Figure 15:
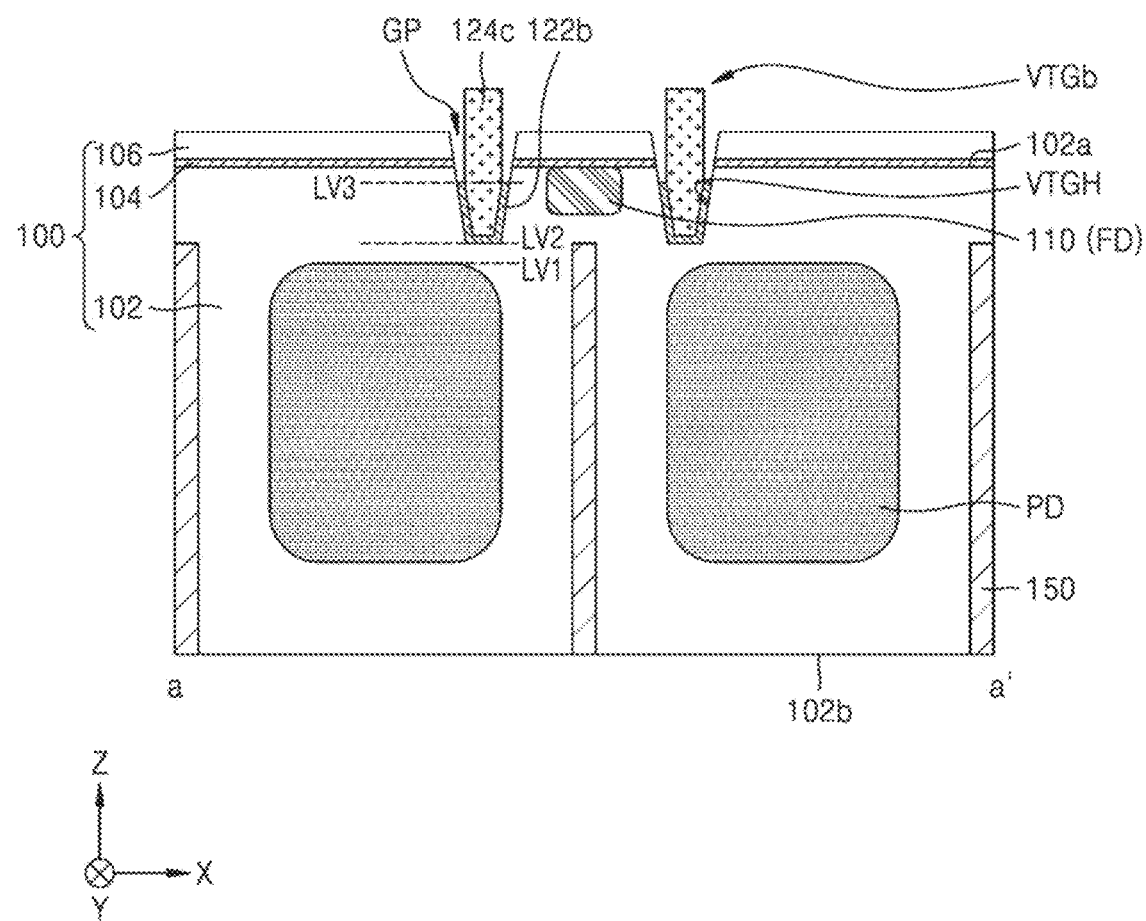
FIG. 15 is a cross-sectional view illustrating a method of manufacturing an image sensor, according to some embodiments of the present inventive concept.

FIG. 15 is a cross-sectional view illustrating a method of manufacturing an image sensor, according to some embodiments of the present inventive concept. In detail, FIG. 15 is a cross-sectional view illustrating a method of manufacturing the image sensor 10d illustrated in FIG. 7, and FIG. 15 is a cross-sectional view taken along a portion corresponding to line a-a' of FIG. 2.

Referring to FIG. 15, after the manufacturing method described above with reference to FIGS. 8A to 10B are performed, a preliminary gate conductive material layer covering the preliminary gate insulation layer 122P illustrated in FIGS. 10A and 10B and filling the plurality of vertical gate holes VTGH may be formed, and then, a gate conductive layer 124c may be formed by patterning the preliminary gate conductive material layer. The gate conductive layer 124c may be formed to fill a portion of each of the plurality of vertical gate holes VTGH.

In a process of forming the gate conductive layer 124c, only a portion, overlapping the gate conductive layer 124c in the vertical direction (the Z direction), of the preliminary gate insulation layer 122P may remain as the gate insulation layer 122b, and the other portion may be removed. For example, the gate insulation layer 122b may be disposed between the base substrate 100 and the gate conductive layer 124c. The gate insulation layer 122b may all overlap the gate conductive layer 124c in the vertical direction. The plurality of transfer gates VTGb may be portions of the gate conductive layer 124c, which fill partial portions of the plurality of vertical gate holes VTGH and are disposed on the gate insulation layer 122b.

The gate insulation layer 122b and the gate conductive layer 124c may fill only a portion of each of the plurality of vertical gate holes VTGH, and a gap portion GP may be formed at a portion, which is not filled by the gate insulation layer 122b and the gate conductive layer 124c, of each of the plurality of vertical gate holes VTGH. The gap portion GP may extend up to the third vertical level LV3 from a top surface of each of the plurality of vertical gate holes VTGH. That is, a lowermost end of the gap portion GP may be disposed at the third vertical level LV3. The third vertical level LV3 may be disposed to be higher than the second vertical level LV2 in the vertical direction (the Z direction). In some embodiments, the third vertical level LV3 may be disposed at a vertical level which is lower than a top surface of the substrate layer 102 (i.e., a bottom surface of the buried insulation layer 104).

A portion, which is higher than the third vertical level LV3, of each of the plurality of transfer gates VTGb may have substantially the same horizontal width along the vertical direction (the Z direction), and a portion, which is lower than the third vertical level LV3, of each of the plurality of transfer gates VTGb may have a tapered shape where a horizontal width thereof narrows in a direction from an upper side thereof to a lower side thereof (i.e., toward the photo sensing device PD).

Subsequently, a gate spacer 130a may be formed by the method of manufacturing the gate spacer 130 described above with reference to FIGS. 11A and 11B. The gate insulation layer 122b and the gate conductive layer 124c may fill only a portion of each of the plurality of vertical gate holes VTGH, and the gate spacer 130a may be formed to fill all of the other portion of each of the plurality of vertical gate holes VTGH (i.e., the gap portion GP).

A lowermost end of the gate spacer 130a may be formed to be disposed at the third vertical level LV3 which is higher than the second vertical level LV2. The gate spacer 130a may include a spacer liner layer 132a, which conformally covers a sidewall of the gate conductive layer 124c and a portion of the gate insulation layer 122b adjacent to the gate conductive layer 124c, and a spacer insulation layer 134 which covers the spacer liner layer 132a. In some embodiments, the spacer liner layer 132a may be formed to fill all of the gap portion GP.

Subsequently, the image sensor 10d illustrated in FIG. 7 may be formed by the manufacturing method described above with reference to FIGS. 12A to 13B.

Figure 16:
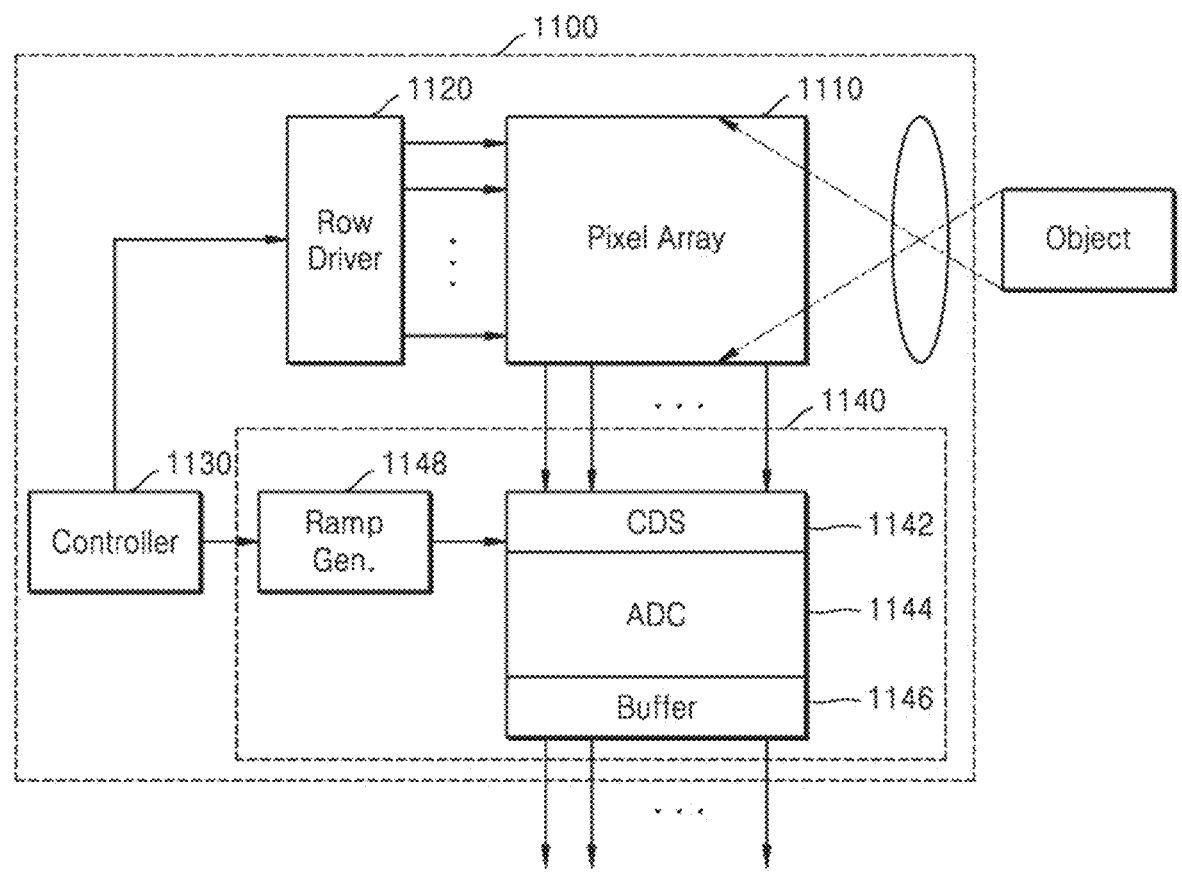
FIG. 16 is a block diagram illustrating a configuration of an image sensor according to some embodiments of the present inventive concept.

FIG. 16 is a block diagram illustrating a configuration of an image sensor 1100 according to some embodiments of the present inventive concept.

Referring to FIG. 16, the image sensor 1100 may include a pixel array 1110, a controller 1130, a row driver 1120, and a pixel signal processor 1140. The image sensor 1100 may include at least one of the image sensors 1, 10, 10a, 10b, 10c, and 10d described above with reference to FIGS. 1 to 15.

The pixel array 1110 may include a plurality of unit pixels arranged two-dimensionally, and each of the unit pixels may include a photo sensing device. The photo sensing device may absorb light to generate an electric charge, and an electrical signal (an output voltage) based on the generated electric charge may be provided to the pixel signal processor 1140 through a vertical signal line. Each of a plurality of unit pixels included in the pixel array 1110 may provide one output voltage at a time by row units, and thus, unit pixels included in one row of the pixel array 1110 may be simultaneously activated by a selection signal output from the row driver 1120. Unit pixels included in a selected row may provide an output line of a column with an output voltage based on the absorbed light.

The controller 1130 may control the row driver 1120 so that the pixel array 1110 absorbs light to accumulate an electric charge, the accumulated electric charge is temporarily stored, an electrical signal based on the stored electric charge is output to the outside of the pixel array 1110. Also, the controller 1130 may control the pixel signal processor 1140 to measure the output voltage provided by the pixel array 1110.

The pixel signal processor 1140 may include a correlation double sampler (CDS) 1142, an analog-to-digital converter (ADC) 1144, and a buffer 1146. The correlation double sampler 1142 may sample and hold an output voltage provided by the pixel array 1110. The correlation double sampler 1142 may sample a certain noise level and a level based on the generated output voltage to output a level corresponding to a difference therebetween. Also, the correlation double sampler 1142 may receive a ramp signal generated by the ramp signal generator 1148 and may compare the ramp signal with the level to output a comparison result. The ADC 1144 may convert an analog signal, corresponding to the level received from the correlation double sampler 1142, into a digital signal. The buffer 1146 may latch the digital signal, and the latched signal may be sequentially output to the outside of the image sensor 1100 and may be transferred to an image processor.

As used herein, an element or region that is "covering" or "surrounding" or "filling" another element or region may completely or partially cover or surround or fill the other element or region.

While the inventive concept has been particularly shown and described with reference to example embodiments thereof, it will be understood that various changes in form and details may be made therein without departing from the scope of the following claims.

What is claimed is:

1. An image sensor comprising:
   a base substrate including a substrate layer having a first conductive type, a semiconductor layer on the substrate layer, and a buried insulation layer between the substrate layer and the semiconductor layer;
   a photo sensing device in the substrate layer, the photo sensing device including an impurity region having a second conductive type that is different from the first conductive type;
   a buried impurity region that is spaced apart from the photo sensing device, is in the substrate layer, and is adjacent to the buried insulation layer, the buried impurity region including an impurity region having the second conductive type;
   a transfer gate including a vertical gate extending through the semiconductor layer and the buried insulation layer and extending into a portion of the substrate layer, wherein the portion of the substrate layer is between the photo sensing device and the buried impurity region; and a planar gate on the semiconductor layer.

2. The image sensor of claim 1, wherein at least a portion of the transfer gate overlaps a portion of the photo sensing device in a vertical direction.

3. The image sensor of claim 2, wherein the transfer gate does not overlap the buried impurity region in the vertical direction.

4. The image sensor of claim 1, wherein the transfer gate is spaced apart from the photo sensing device in a vertical direction by a first distance, and the buried impurity region is spaced apart from the photo sensing device in the vertical direction by a second distance that is longer than the first distance.

5. The image sensor of claim 1, wherein the transfer gate extends into the photo sensing device.

6. The image sensor of claim 1, wherein the planar gate comprises a plurality of planar gates, and the plurality of planar gates are spaced apart from one another and comprise a reset gate, a source follower gate, and a selection gate, and
at least a portion of the source follower gate overlaps a portion of the buried impurity region in a vertical direction.

7. The image sensor of claim 6, wherein the source follower gate is electrically connected to the buried impurity region.

8. The image sensor of claim 1, further comprising a gate insulation layer between the substrate layer and the planar gate,
wherein a thickness of the buried insulation layer and a thickness of the gate insulation layer are equal.

9. The image sensor of claim 1, further comprising a gate insulation layer between the substrate layer and the planar gate,
wherein a thickness of the buried insulation layer is greater than a thickness of the gate insulation layer.

10. The image sensor of claim 1, wherein the transfer gate comprises:
a buried portion in a vertical gate hole that extends through the semiconductor layer and the buried insulation layer and is in the substrate layer; and
a cap portion that is outside of the vertical gate hole and is provided as one body with the buried portion, wherein a widest width of the cap portion in a horizontal direction is greater than a widest width of the buried portion in the horizontal direction.

11. The image sensor of claim 1, wherein the transfer gate comprises a buried portion in a vertical gate hole that extends through the semiconductor layer and the buried insulation layer and is in the substrate layer and a cap portion that is outside of the vertical gate hole, and
wherein the image sensor further comprises a gate spacer that is on a sidewall of the cap portion of the transfer gate and extends between the buried portion of the transfer gate and the substrate layer.

12. An image sensor comprising:
a base substrate including a substrate layer having a first conductive type, a semiconductor layer on the substrate layer, and a buried insulation layer separating the substrate layer from the semiconductor layer;
a plurality of photo sensing devices that are spaced apart from one another in the substrate layer, the plurality of photo sensing devices each including an impurity region having a second conductive type that is different from the first conductive type;
a buried impurity region that is in the substrate layer and is spaced apart from the plurality of photo sensing devices to extend in a first direction between the plurality of photo sensing devices in a plan view, the buried impurity region including an impurity region that has the second conductive type and is adjacent to the buried insulation layer;
a plurality of transfer gates that extend through the semiconductor layer and the buried insulation layer and are in the substrate layer, wherein each of the plurality of transfer gates is between a respective one of the plurality of photo sensing devices and the buried impurity region, overlaps the respective one of the plurality of photo sensing devices in a vertical direction, and does not overlap the buried impurity region in the vertical direction; and
a plurality of planar gates that are spaced apart from one another on the semiconductor layer in a second direction that is different from the first direction.

13. The image sensor of claim 12, wherein the substrate layer includes a first surface facing the buried insulation layer and a second surface that is opposite the first surface,
the plurality of photo sensing devices include respective top surfaces facing the buried insulation layer, and the plurality of transfer gates include respective bottom surfaces in the substrate layer, and
the first surface of the substrate layer is closer to the bottom surfaces of the plurality of transfer gates than the top surfaces of the plurality of photo sensing devices.

14. The image sensor of claim 12, wherein the substrate layer includes a first surface facing the buried insulation layer and a second surface that is opposite the first surface,
the plurality of photo sensing devices include respective top surfaces facing the buried insulation layer, and the plurality of transfer gates include respective bottom surfaces in the substrate layer, and
the first surface of the substrate layer is closer to the top surfaces of the plurality of photo sensing devices than the bottom surfaces of the plurality of transfer gates.

15. The image sensor of claim 12, further comprising a plurality of gate spacers, wherein first ones of the plurality of gate spacers are on respective side surfaces of portions of the plurality of transfer gates, and second ones of the plurality of gate spacers are on respective side surfaces of the plurality of planar gates.

16. The image sensor of claim 15, wherein each of the first ones of the plurality of gate spacers extends between the base substrate and a respective one of the plurality of transfer gates.

17. The image sensor of claim 16, wherein each of the first ones the plurality of gate spacers extends between the substrate layer and the respective one of the plurality of transfer gates.

18. An image sensor comprising:
a base substrate including a substrate layer having a first conductive type, a semiconductor layer on the substrate layer, and a buried insulation layer separating the substrate layer from the semiconductor layer, wherein the substrate layer includes a first surface facing the buried insulation layer and a second surface that is opposite the first surface;
a plurality of photo sensing devices that are spaced apart from one another in the substrate layer and are arranged along a first horizontal direction and a second horizontal direction that is perpendicular to the first horizontal direction, the plurality of photo sensing devices each including an impurity region having a second conductive type that is different from the first conductive type;

a buried impurity region that is in the substrate layer and is spaced apart from the plurality of photo sensing devices to extend in the second horizontal direction between the plurality of photo sensing devices in a plan view, the buried impurity region including an impurity region that has the second conductive type and is adjacent to the buried insulation layer;

a plurality of transfer gates that extend through the semiconductor layer and the buried insulation layer and are in the substrate layer, wherein each of the plurality of transfer gates is between a respective one of the plurality of photo sensing devices and the buried impurity region, overlaps the respective one of the plurality of photo sensing devices in a vertical direction, and does not overlap the buried impurity region in the vertical direction;

a plurality of planar gates that are spaced apart from one another on the semiconductor layer in the first horizontal direction;

a plurality of impurity regions that are in the semiconductor layer and are adjacent to respective side surfaces of the plurality of planar gates;

a plurality of color filter layers on the second surface of the substrate layer, at least a portion of each of the plurality of color filter layers overlapping a corresponding photo sensing device of the plurality of photo sensing devices in the vertical direction; and a plurality of micro-lenses respectively on the plurality of color filter layers.

19. The image sensor of claim 18, wherein the plurality of planar gates comprise a reset gate, a source follower gate, and a selection gate, at least a portion of the source follower gate overlaps a portion of the buried impurity region in the vertical direction, and the source follower gate is electrically connected to the buried impurity region and is configured to operate as a double gate.

20. The image sensor of claim 19, further comprising a gate insulation layer that is between the substrate layer and the plurality of transfer gates and is between the substrate layer and the plurality of planar gates, wherein each of a thickness of the buried insulation layer and a thickness of the gate insulation layer is about 30 Å to about 70 Å.

* * * * *